US011004899B2

(12) United States Patent
Aggarwal et al.

(10) Patent No.: US 11,004,899 B2
(45) Date of Patent: May 11, 2021

(54) MAGNETORESISTIVE DEVICES AND METHODS THEREFOR

(71) Applicant: Everspin Technologies, Inc., Chandler, AZ (US)

(72) Inventors: Sanjeev Aggarwal, Scottsdale, AZ (US); Jijun Sun, Chandler, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

(21) Appl. No.: 16/395,396

(22) Filed: Apr. 26, 2019

(65) Prior Publication Data

US 2020/0343300 A1 Oct. 29, 2020

(51) Int. Cl.
  *H01L 27/22* (2006.01)
  *H01L 43/08* (2006.01)
  *H01L 43/10* (2006.01)
  *H01L 43/12* (2006.01)

(52) U.S. Cl.
  CPC ............ *H01L 27/228* (2013.01); *H01L 43/08* (2013.01); *H01L 43/10* (2013.01); *H01L 43/12* (2013.01)

(58) Field of Classification Search
  CPC ....... H01L 27/228; H01L 43/08; H01L 43/10; H01L 43/12
  See application file for complete search history.

(56) References Cited

U.S. PATENT DOCUMENTS

| 8,686,484 | B2 | 4/2014 | Whig et al. |
| 8,747,680 | B1 | 6/2014 | Deshpande et al. |
| 9,023,216 | B2 | 5/2015 | Kochergin et al. |
| 9,136,464 | B1 | 9/2015 | Whig et al. |
| 9,419,208 | B2 | 8/2016 | Whig et al. |
| 9,502,644 | B1 | 11/2016 | Nagamine et al. |
| 2002/0114112 | A1 | 8/2002 | Nakashio et al. |
| 2018/0068681 | A1* | 3/2018 | Sasaki ............... H01L 43/10 |
| 2018/0158498 | A1 | 6/2018 | Aggarwal et al. |
| 2019/0088856 | A1 | 3/2019 | Yoshikawa et al. |
| 2019/0103552 | A1* | 4/2019 | Shiokawa ........... H01F 10/3286 |
| 2019/0355900 | A1* | 11/2019 | Kim ................. H01L 43/10 |
| 2019/0393265 | A1* | 12/2019 | Ying ............... H01L 43/10 |
| 2020/0185015 | A1* | 6/2020 | Le ................. H01L 43/10 |

OTHER PUBLICATIONS

International Search Report and Written Opinion in International Application No. PCT/US2020/016365, dated Jun. 5, 2020 (12 pages).

* cited by examiner

*Primary Examiner* — Nathan W Ha

(74) *Attorney, Agent, or Firm* — Bookoff McAndrews, PLLC

(57) ABSTRACT

A magnetoresistive device may include a first ferromagnetic region, a second ferromagnetic region, and an intermediate region positioned between the first ferromagnetic region and the second ferromagnetic region. The intermediate region may be formed of a dielectric material and comprise at least two different metal oxides.

21 Claims, 20 Drawing Sheets

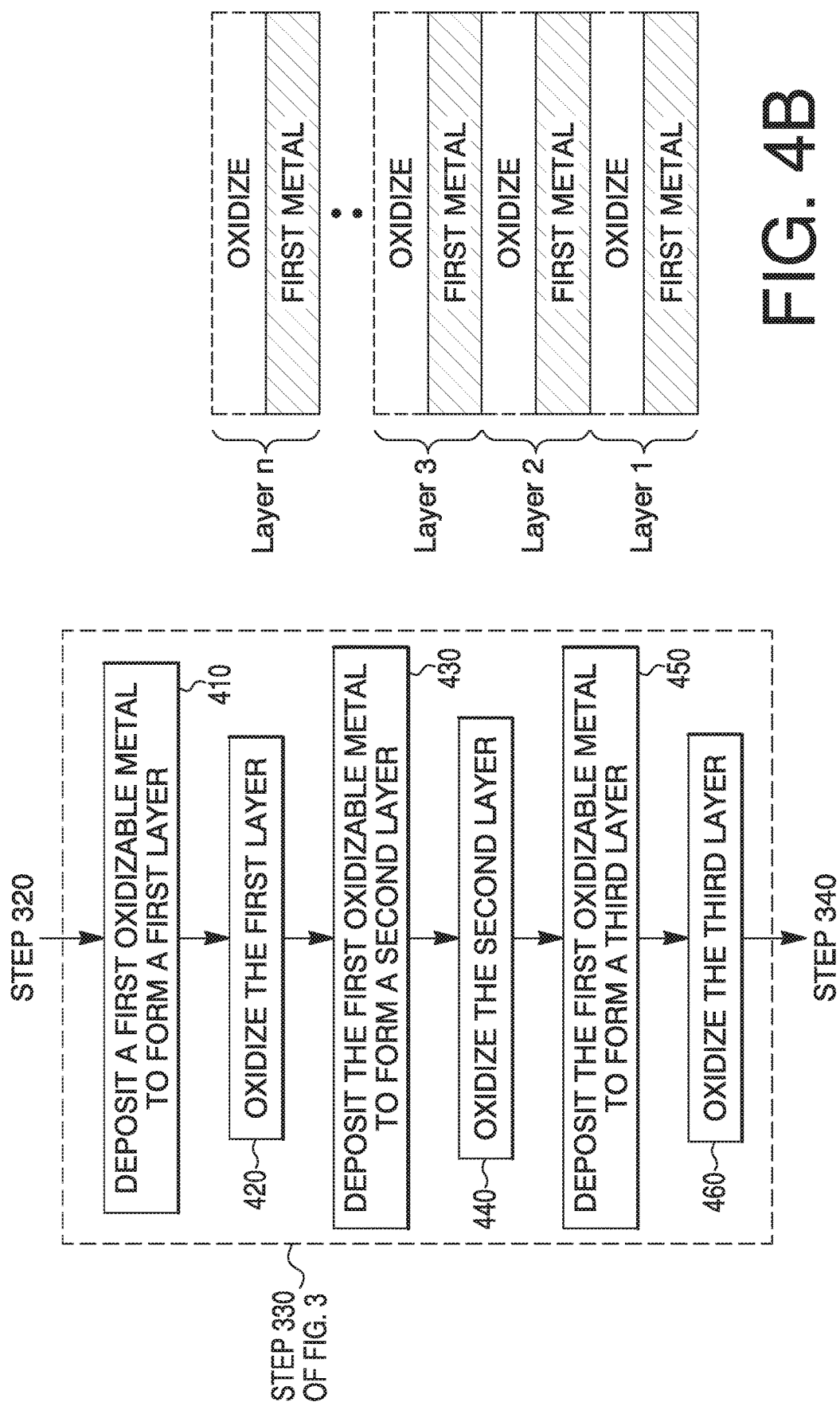

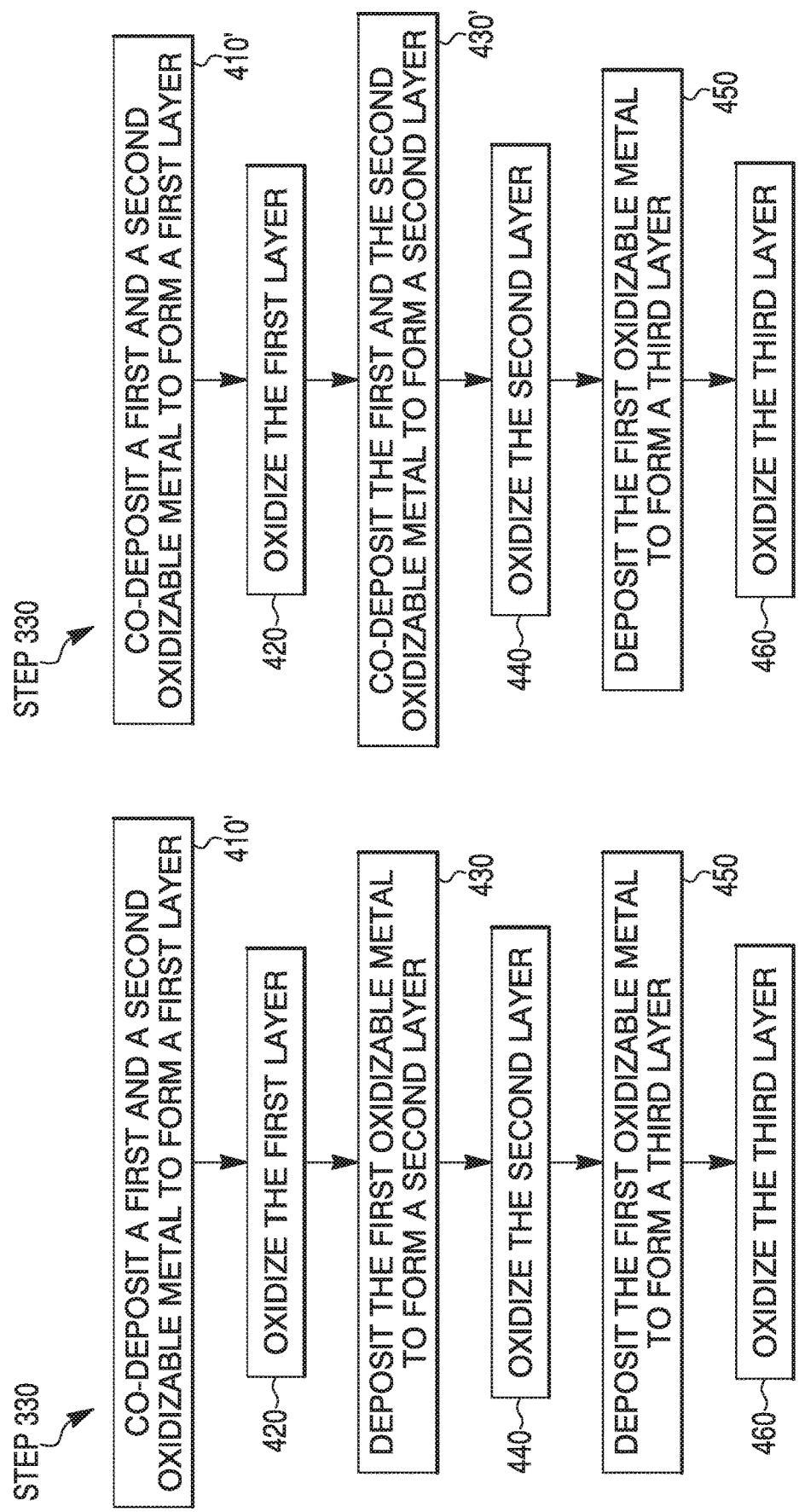

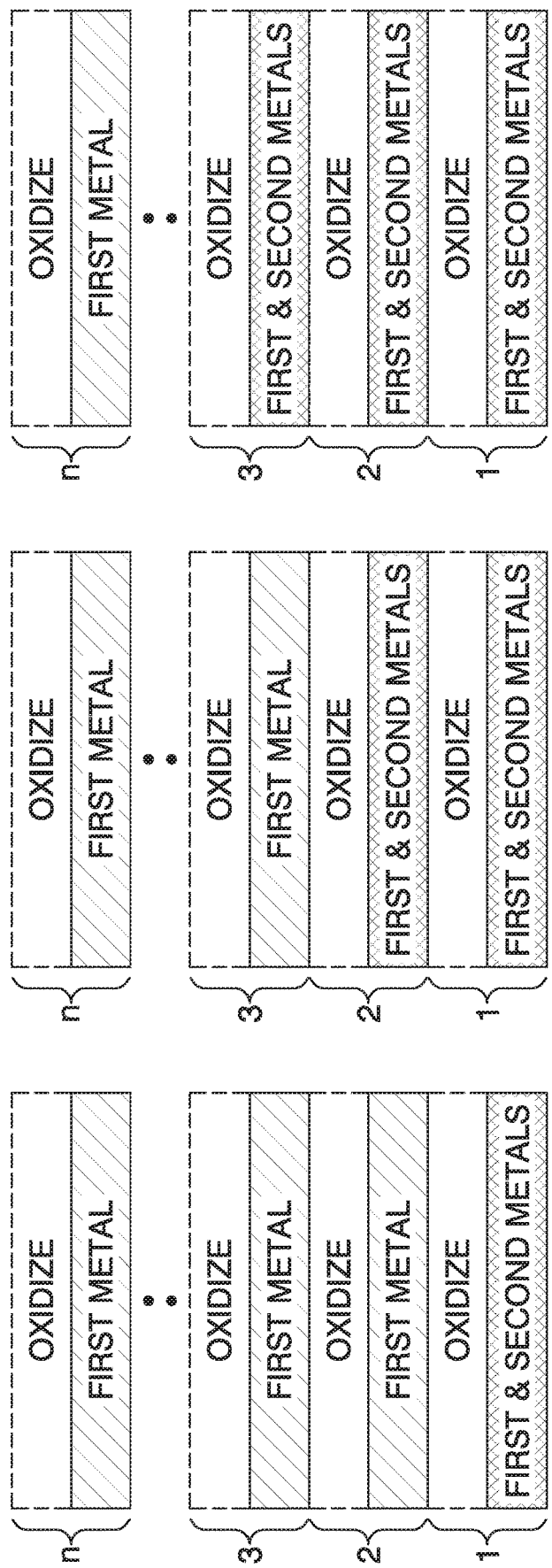

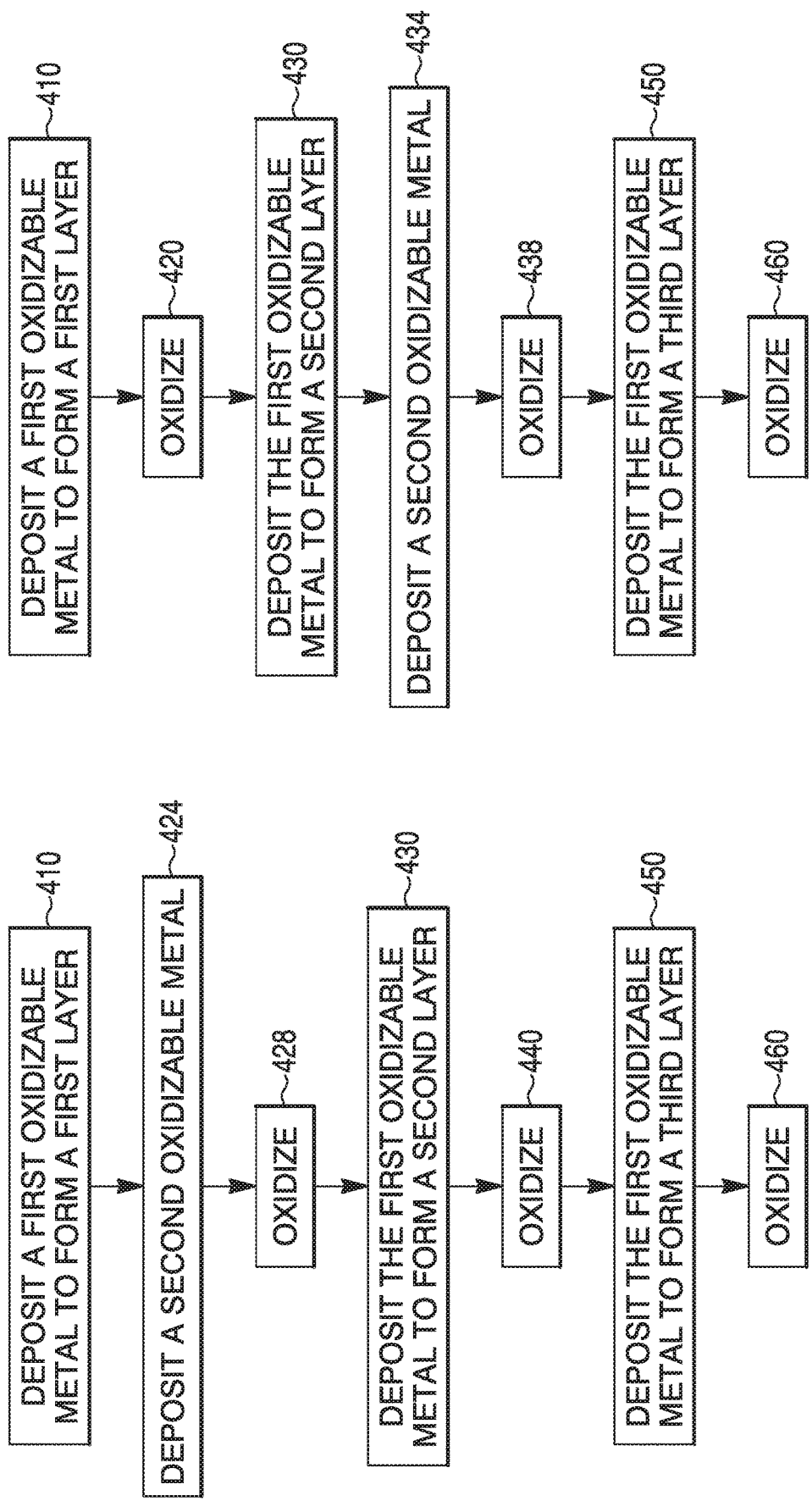

MAGNETORESISTIVE DEVICES AND METHODS THEREFOR

TECHNICAL FIELD

The present disclosure relates to, among other things, methods for fabricating magnetoresistive devices and the resulting magnetoresistive devices.

INTRODUCTION

There are many inventions described and illustrated herein, as well as many aspects and embodiments of those inventions. In one aspect, the present disclosure relates to methods of manufacturing magnetoresistive stacks/structures, the resulting magnetoresistive stacks/structures, and devices using the magnetoresistive stacks/structures. In one embodiment, an exemplary magnetoresistive stack/structure of the present disclosure is used in a magnetic tunnel junction magnetoresistive device (MTJ device), such as, for example, a magnetoresistive memory device, magnetoresistive sensor device, magnetoresistive transducer device, etc.

Briefly, an MTJ device (e.g., a magnetoresistive random access memory (MRAM) device) includes a magnetoresistive memory stack/structure having at least one non-magnetic layer (including, for example, one or more dielectric layers) disposed between a "fixed" magnetic region and a "free" magnetic region, each including one or more layers of ferromagnetic materials. Information is stored in the magnetoresistive stack/structure by switching, programming, and/or controlling the direction of magnetization vectors in the magnetic layer(s) of the "free" magnetic region. The direction of the magnetization vectors of the "free" magnetic region may be switched and/or programmed (for example, through spin transfer torque (STT), spin orbit torque (SOT), or a magnetic field generated by electrical current passing through a nearby conductor) by application of a write signal (e.g., one or more current pulses) through (or adjacent, in the case of spin orbit torque, or above or below, in case of switching of "free" magnetic region by magnetic field generated by electrical current through write lines) to the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack/structure has a second magnetic state. The electrical resistance of the magnetoresistive memory stack/structure (called tunneling resistance) depends on its magnetic state. For example, the first magnetic state may correspond to a state of relatively low(er) electrical resistance and the second magnetic state may correspond to a state of relatively high(er) electrical resistance. The magnetic state of the magnetoresistive memory stack/structure is determined or read based on the resistance of the stack/structure in response to a read current applied through the magnetoresistive stack. Properties such as, for example, magnetoresistance (MR), resistance-area product (RA), delta RA (or change in RA), etc. determine the electrical/magnetic performance of the magnetoresistive memory stack/structure. In some embodiments, the methods of fabricating magnetoresistive stacks/structures described herein provide improvements in at least some of these properties. The scope of the current disclosure, however, is defined by the attached claims, and not by any characteristics of the resulting device or method.

It should be noted that, although exemplary embodiments are described in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a "fixed" magnetic region. For the sake of brevity, the discussions and illustrations presented in this disclosure will not be repeated specifically in the context of GMR or other magnetoresistive stacks/structures—but such discussions and illustrations are to be interpreted as being entirely applicable to GMR and other magnetoresistive stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks/structures may have a different order (e.g., the opposite order (i.e., from top to bottom)). For example, a "fixed" magnetic region may be formed on or above a "free" magnetic region or layer, which in turn may be formed on or above an insertion layer of the present disclosure.

Figure 1:
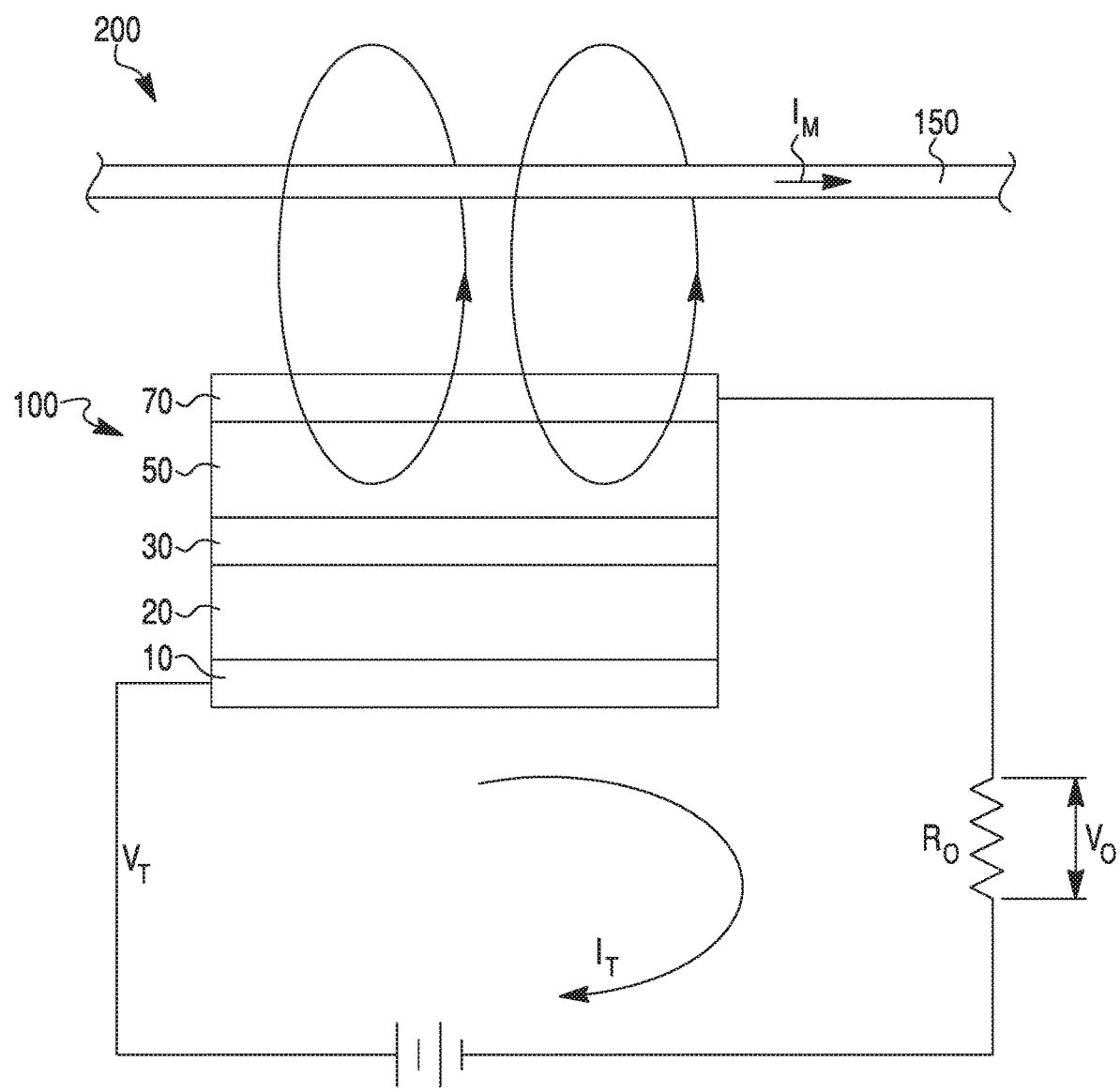
Figure 2A:
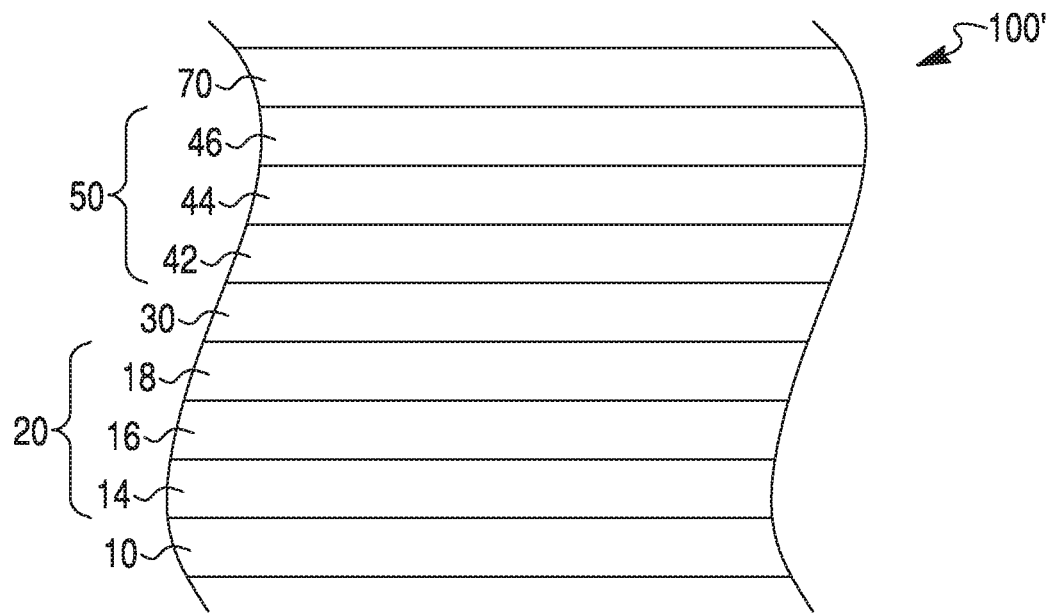
Figure 2B:
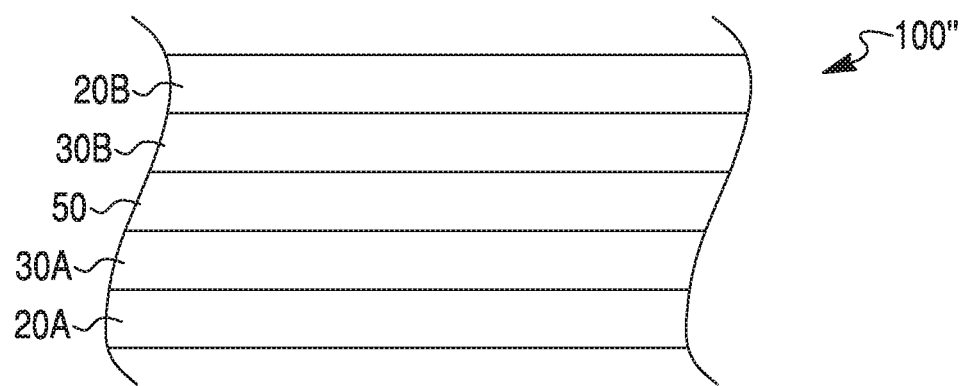
Figure 3:
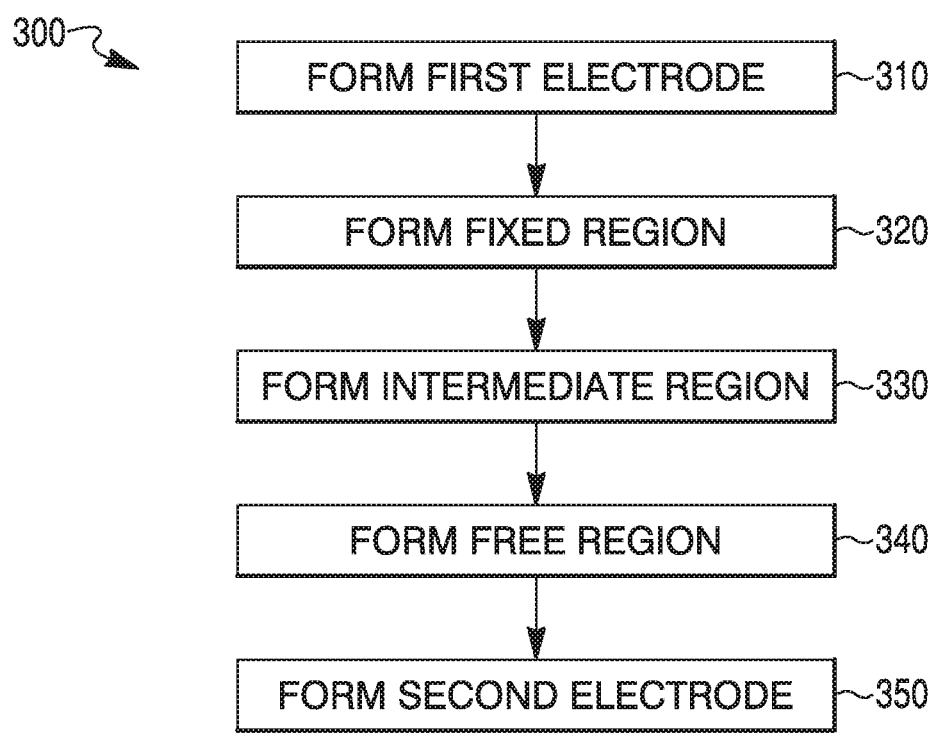
Figure 5C:
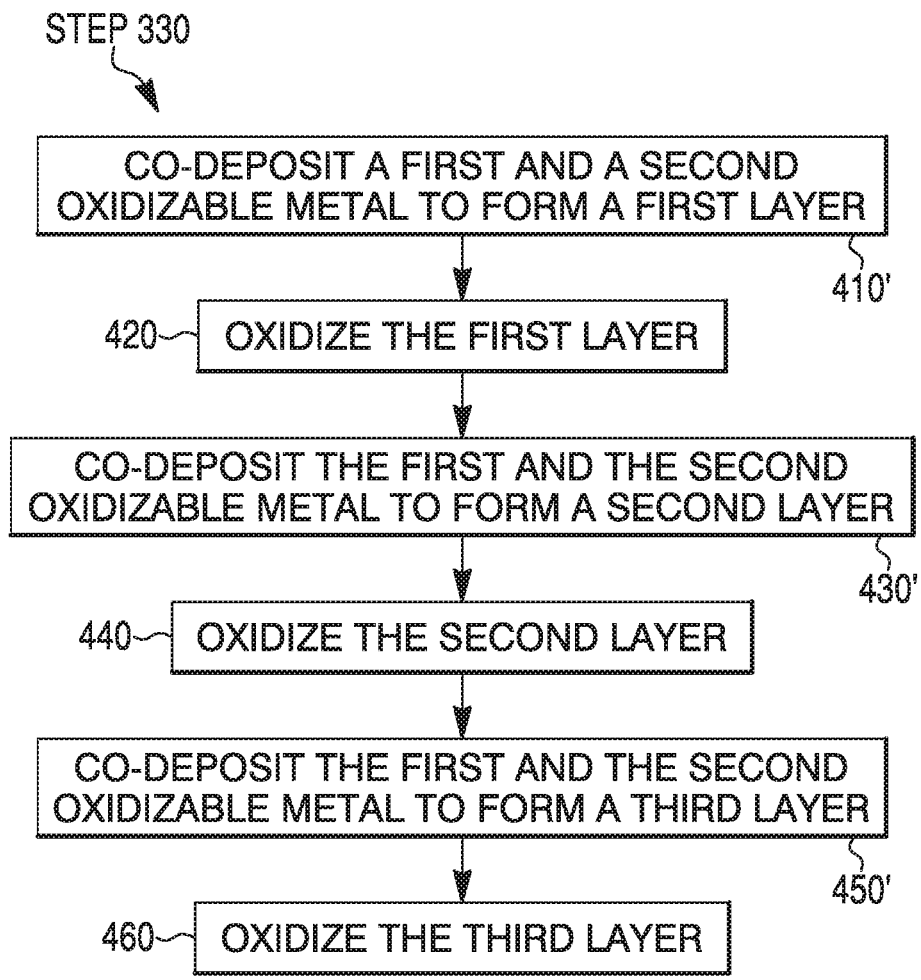
Figures 6D, 6E, 6F:
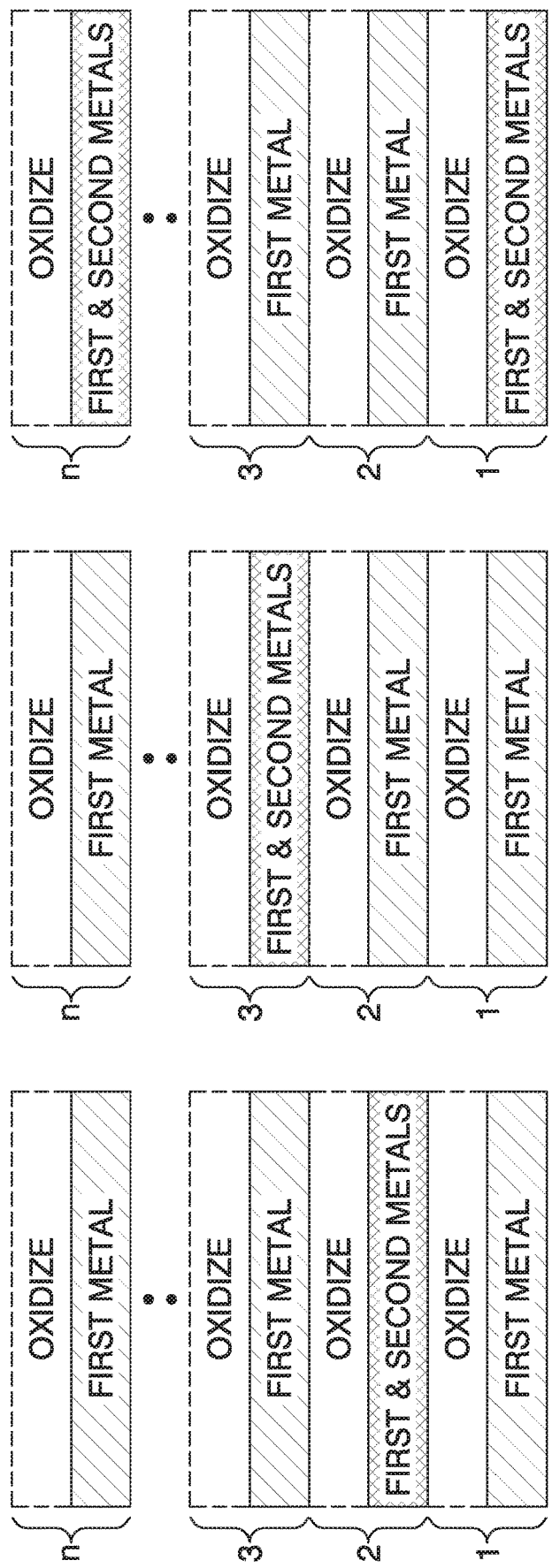
Figure 7A:
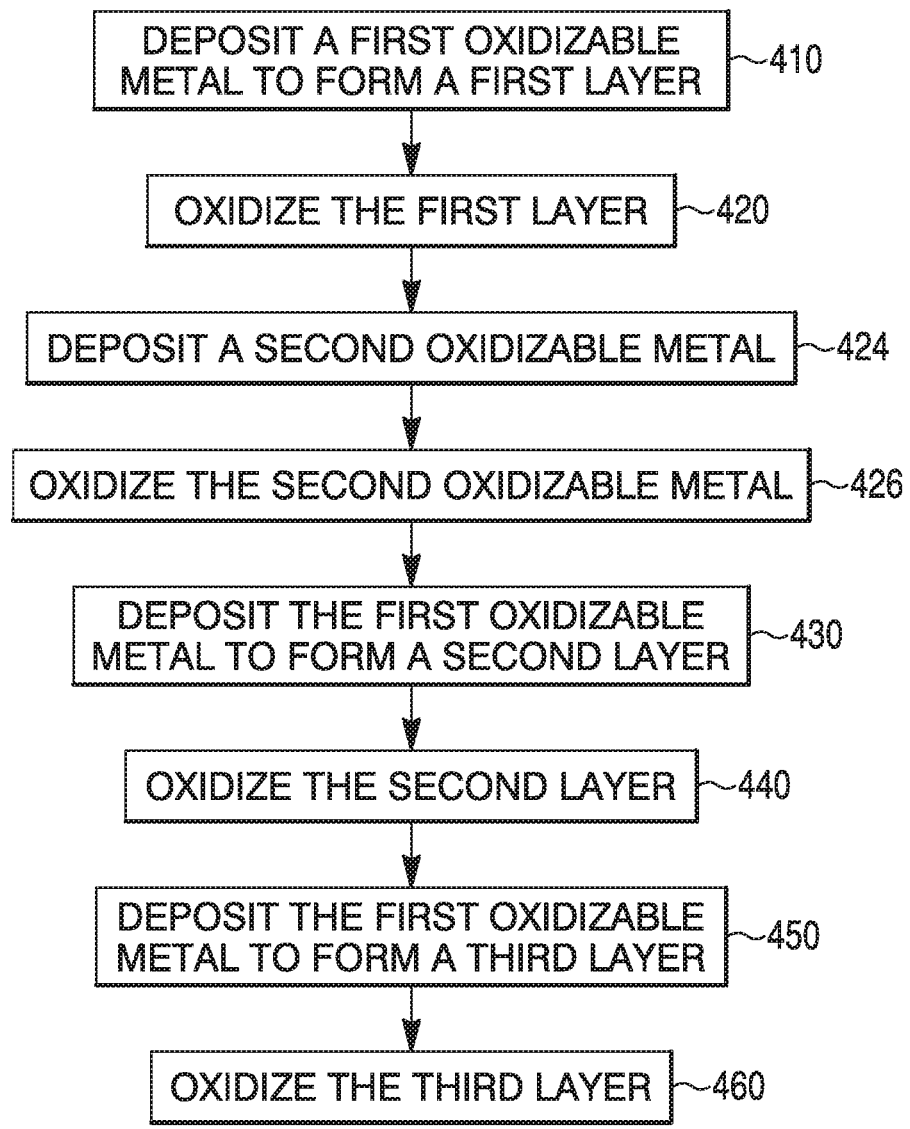
Figure 7B:
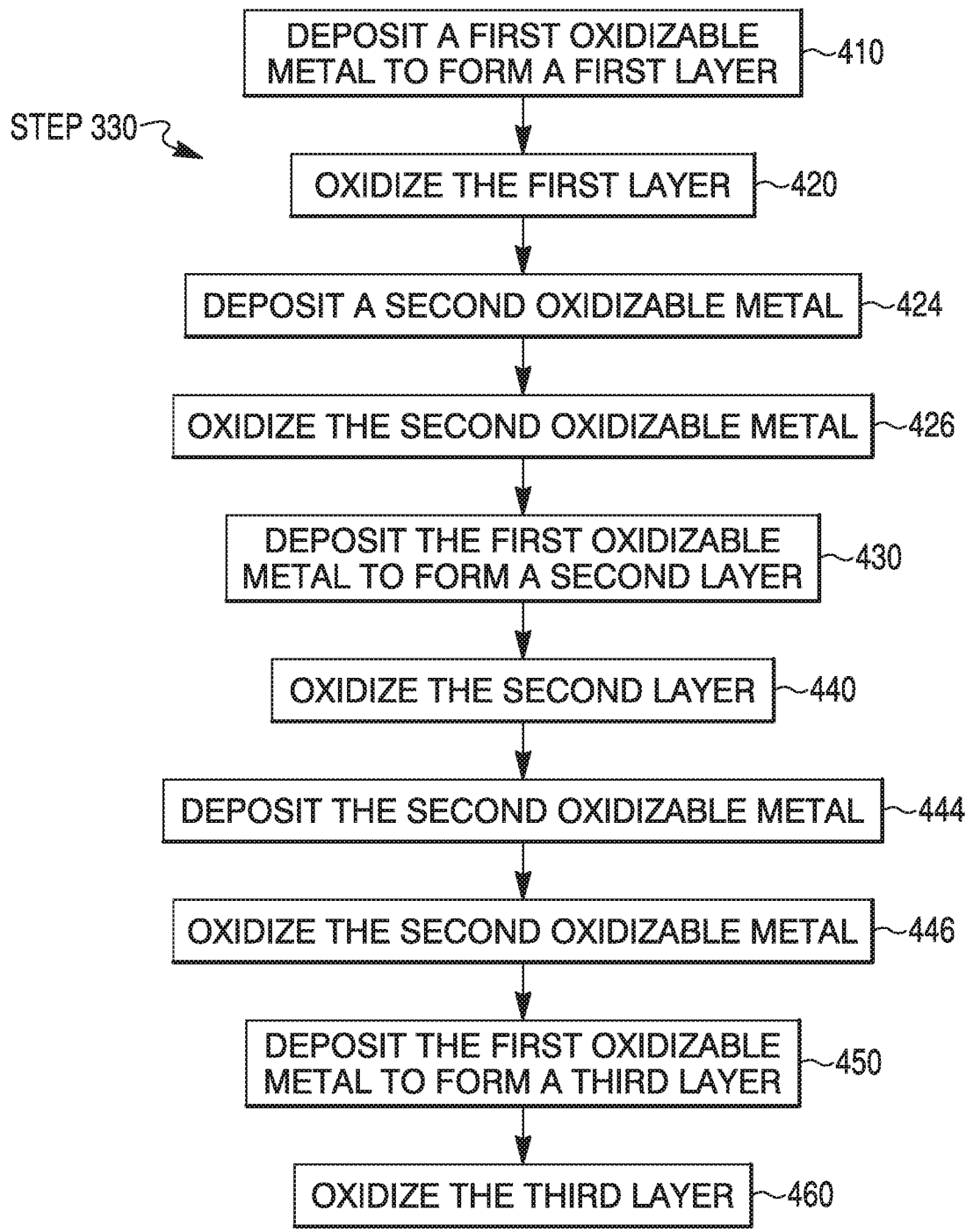
Figure 7C:
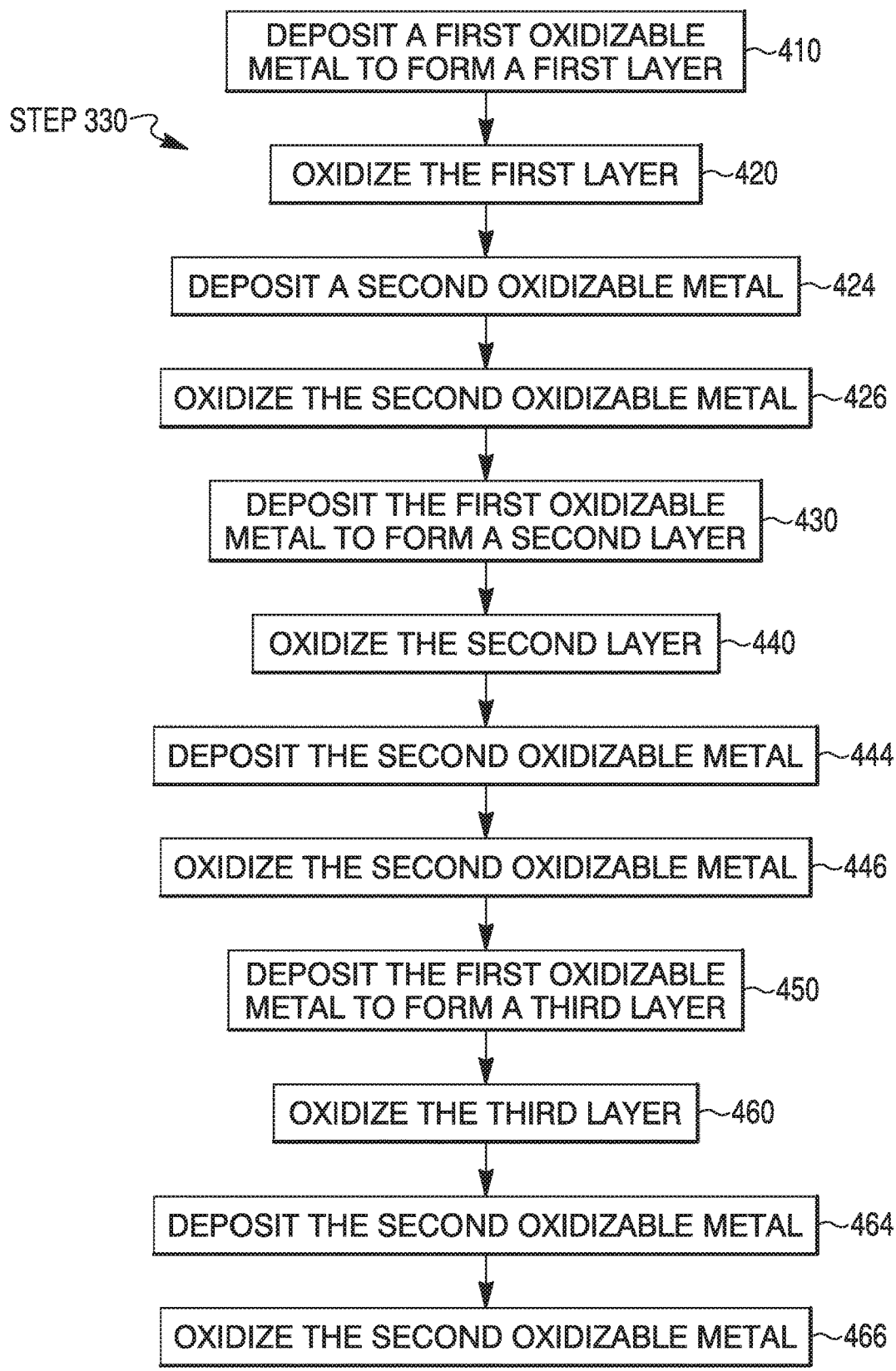
Figure 8C:
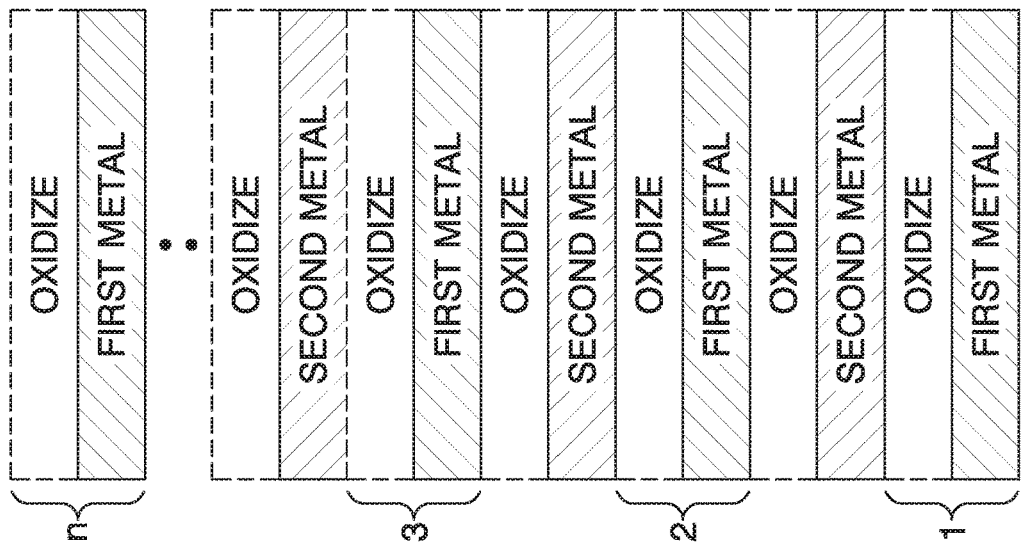
Figure 8B:
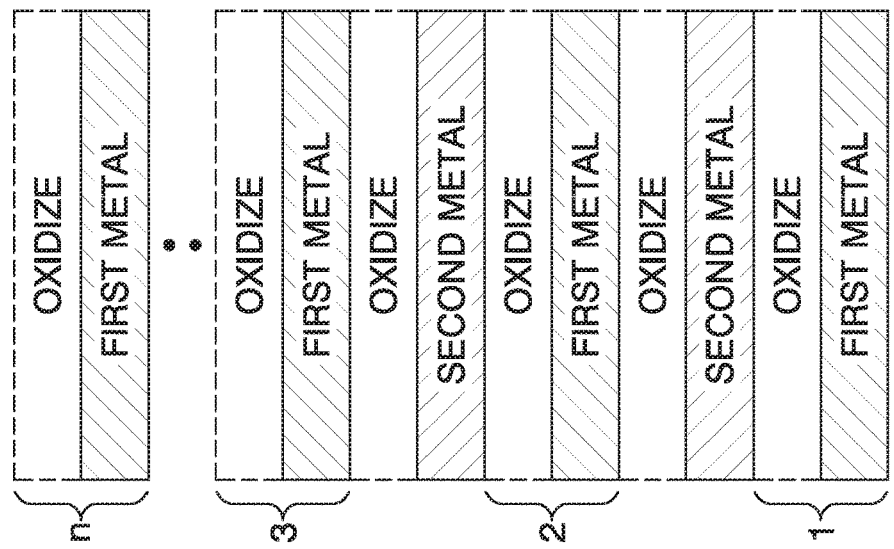
Figure 8A:
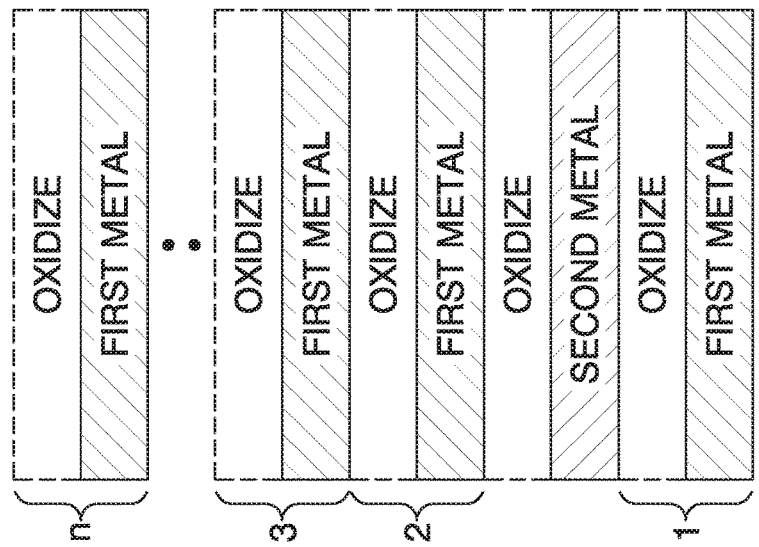
Figure 8E:
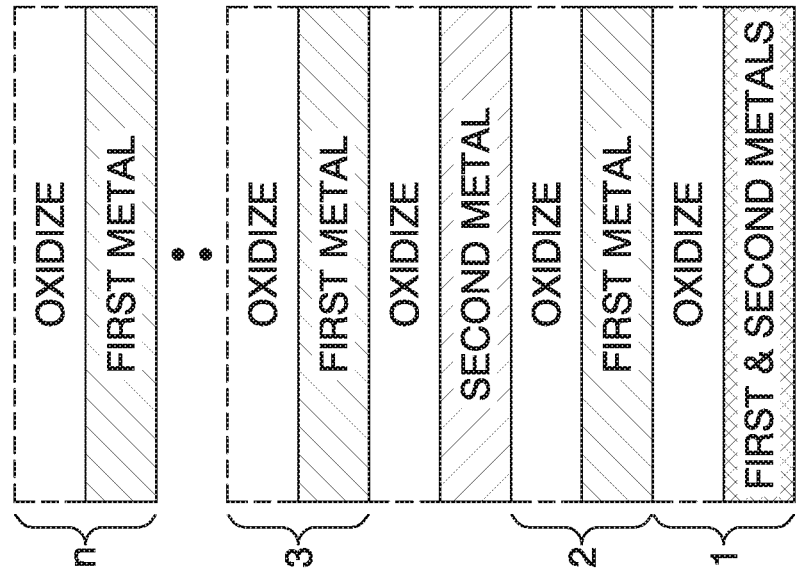
Figure 8D:
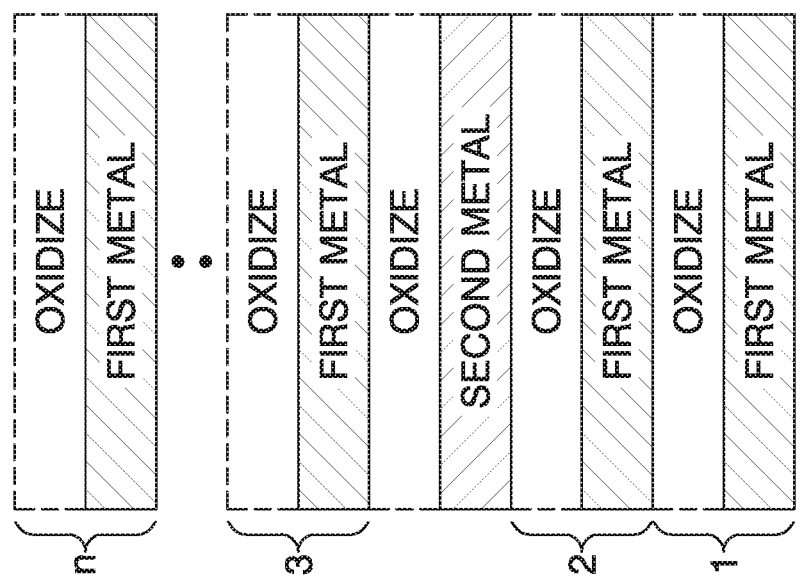
Figure 9C:
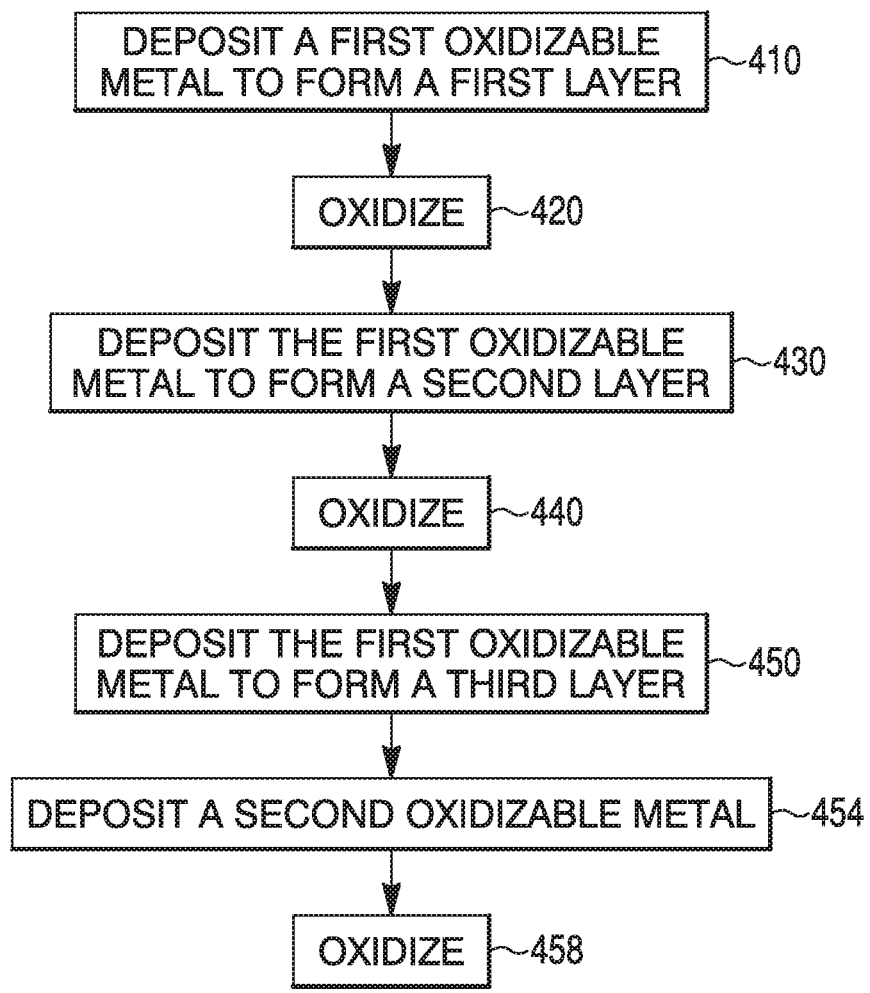
Figure 10C:
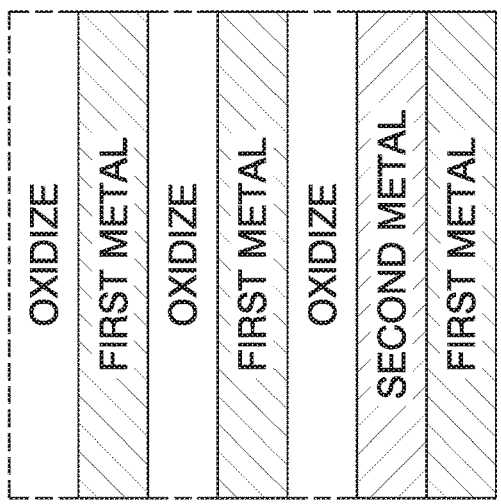
Figure 10B:
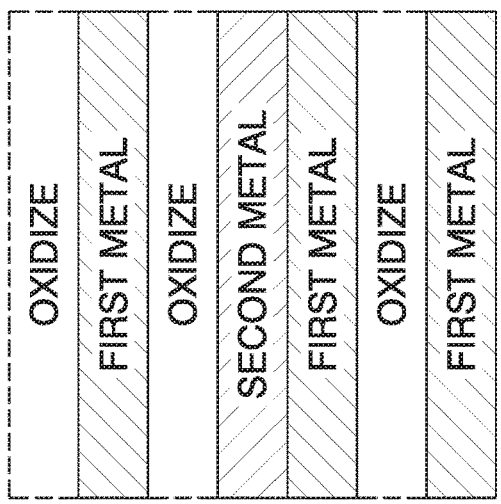
Figure 10A:
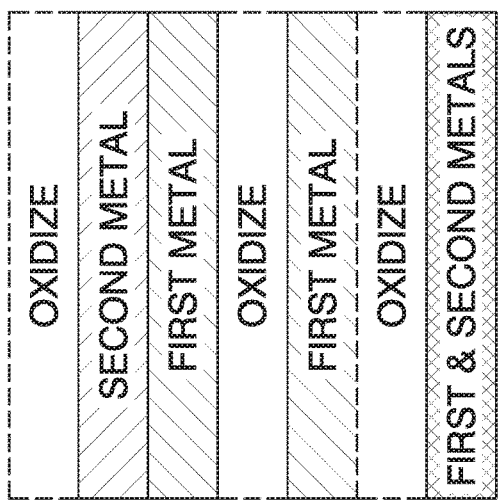
Figure 10D:
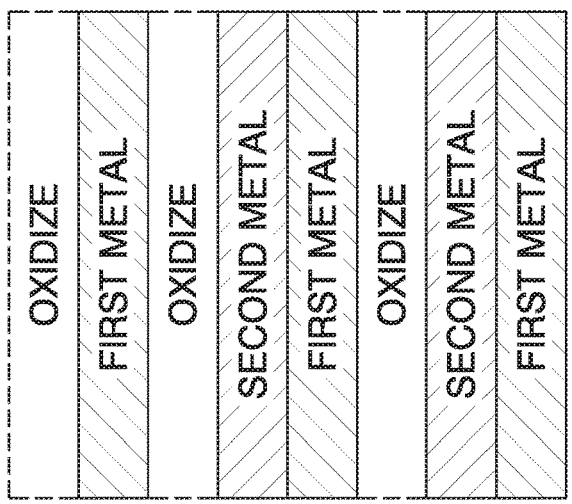
Figure 10E:
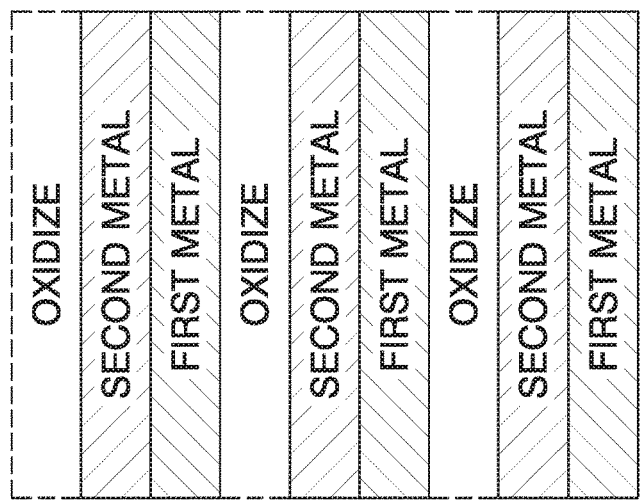
Figure 10F:
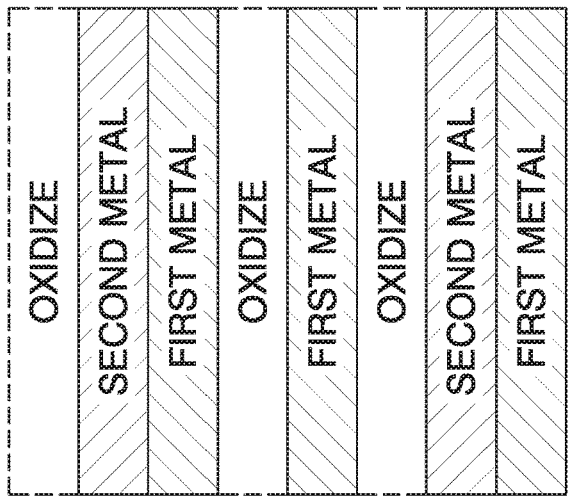
Figure 11A:
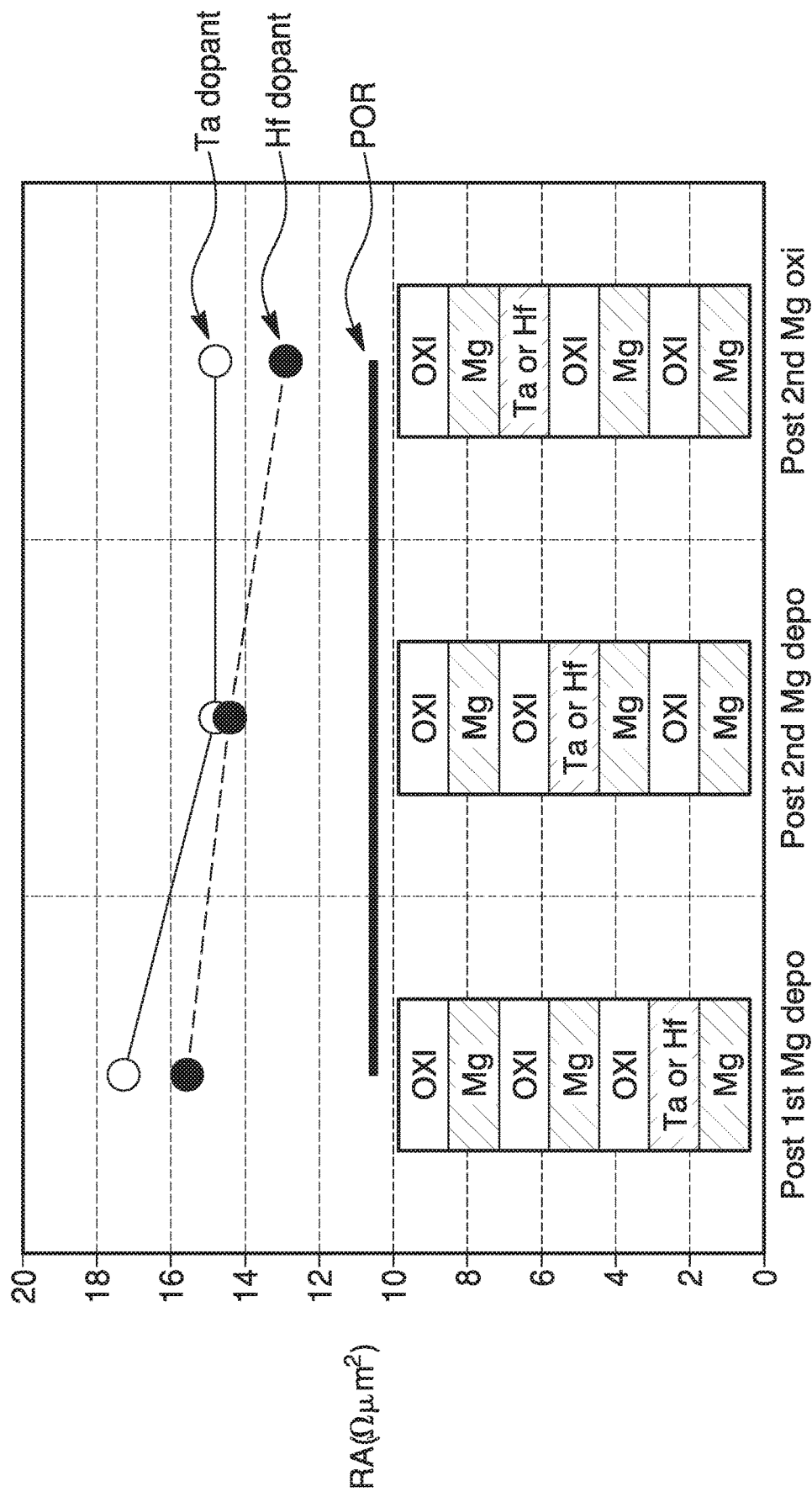
Figure 11B:
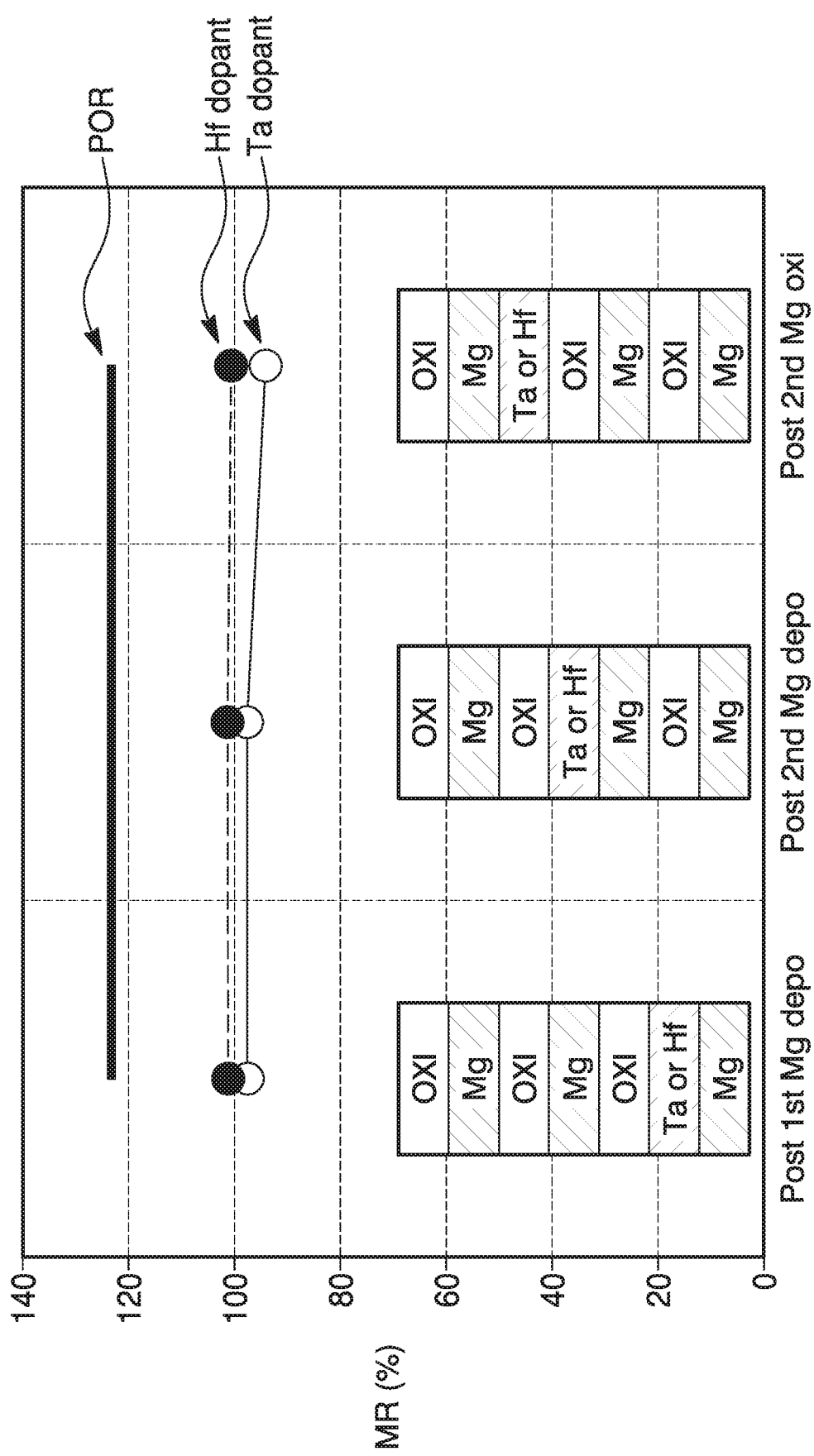
Figure 12:
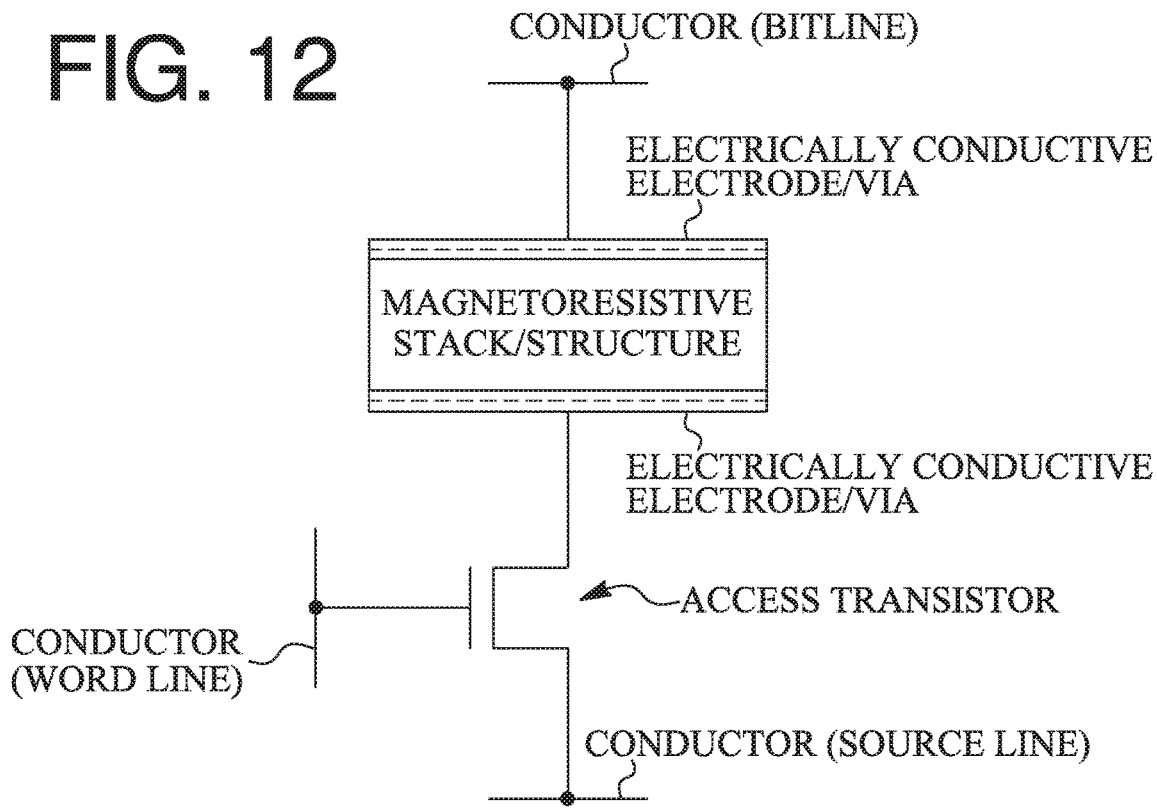
Figure 13A:
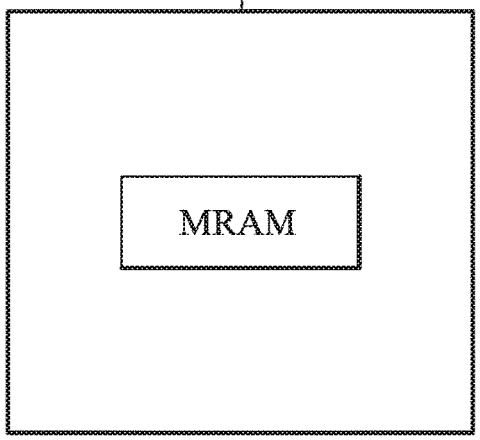
Figure 13B:
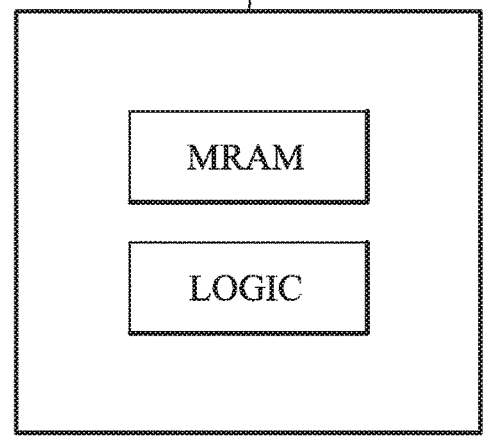

FIG. 1 is a simplified schematic diagram of the electrical circuit of an exemplary magnetic tunnel junction type magnetoresistive device having an exemplary magnetic tunnel junction bit;

FIGS. 2A-2B illustrate cross-sectional views showing different exemplary stacks/structures of the magnetic tunnel junction bit of FIG. 1;

FIG. 3 is a flow chart of an exemplary method of fabricating the magnetic tunnel junction bit of FIG. 1;

FIG. 4A is a flow chart of an exemplary method of fabricating the intermediate region, including a dielectric material, of the magnetic tunnel junction bit of FIG. 1;

FIG. 4B is a schematic representation of the fabrication method of FIG. 4A;

FIGS. 5A-5C are flow charts of other exemplary methods of fabricating the intermediate region of the magnetic tunnel junction bit of FIG. 1;

FIGS. 6A-6C are schematic representations of the fabrication methods of FIGS. 5A-5C, respectively;

FIGS. 6D-6F are schematic representations of other exemplary fabrication methods of the intermediate region of the magnetic tunnel junction bit of FIG. 1;

FIGS. 7A-7C are flow charts of other exemplary methods of fabricating the intermediate region of the magnetic tunnel junction bit of FIG. 1;

FIGS. 8A-8C are schematic representations of the fabrication methods of FIGS. 7A-7C, respectively;

FIGS. 8D-8E are schematic representations of other exemplary fabrication methods of the intermediate region of the magnetic tunnel junction bit of FIG. 1;

FIGS. 9A-9C are flow charts of other exemplary methods of fabricating the intermediate region of the magnetic tunnel junction bit of FIG. 1;

FIGS. 10A-10C are schematic representations of the fabrication methods of FIGS. 9A-9C, respectively;

FIGS. 10D-10F are schematic representations of other exemplary fabrication methods of the intermediate region of the magnetic tunnel junction bit of FIG. 1;

FIGS. 11A and 11B illustrate experimental results obtained using exemplary magnetoresistive devices according to certain embodiments of the present disclosure;

FIG. 12 is a schematic diagram of an exemplary magnetoresistive memory stack/structure electrically connected to an access transistor in a magnetoresistive memory cell configuration; and FIGS. 13A-13B are schematic block diagrams of integrated circuits including a discrete memory device and an embedded memory device, each including an MRAM (which, in one embodiment is representative of one or more arrays of MRAM having a plurality of magnetoresistive memory stacks), according to aspects of certain embodiments of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In the exemplary embodiments described herein, the disclosed magnetoresistive stacks/structures are described as including an intermediate region made of an electrically insulating or dielectric material positioned (or sandwiched) between two ferromagnetic regions to form a magnetic tunnel junction (MTJ) device or an MTJ-type device. However, as previously explained, in some embodiments, the intermediate region may be a non-magnetic, electrically conductive material (e.g., copper, gold, or alloys thereof), and the magnetoresistive stack may form a giant magnetoresistance (GMR) or GMR-type device. For simplicity, in the discussion below, a magnetoresistive stack/structure is referred to as a magnetorestsitive stack or as an MTJ stack. Of the two ferromagnetic regions disposed on either side of the intermediate region in an MTJ stack, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector of the "free" region. On the other hand, the words "fixed" and "pinned" are used to refer to ferromagnetic regions having a magnetic moment vector that does not move substantially in response to such applied magnetic fields or spin-polarized currents. For the sake of simplicity, in the discussion below, the magnetically "fixed" region of an MTJ stack is simply referred to as the fixed region, and the magnetically "free" region is simply referred to as the free region.

FIG. 1 is a simplified schematic diagram of an electrical circuit for an exemplary MTJ device 200 that includes an exemplary MTJ bit 100 (e.g., comprising an MTJ stack) and a magnetic field source 150. It should be noted that although only a single MTJ bit 100 is illustrated in FIG. 1, as would be recognized by a person of ordinary skill in the art, MTJ device 200 may include a plurality of MTJ bits 100 arranged in, e.g., a MRAM array. MTJ bit 100 comprises a fixed region 20 made of a ferromagnetic material separated from a free region 50 made of a ferromagnetic material by an intermediate region 30 made of a dielectric material. The dielectric intermediate region 30 serves as a tunnel barrier layer of MTJ device 200. As illustrated in FIG. 1, fixed region 20, intermediate region 30, and free region 50 form a metal-insulator-metal sandwich structure. In the exemplary embodiment illustrated in FIG. 1, MTJ bit 100 includes a bottom electrode 10 and a top electrode 70 provided on either side of the metal-insulator-metal structure. In some embodiments, one or both of the bottom and top electrodes 10, 70 may be eliminated. In some embodiments, the fixed region 20 may include a pinning region next to, or proximate, bottom electrode 10. A tunneling current $I_T$ can flow through MTJ bit 100 in response to a voltage $V_T$ applied across electrodes 10, 70. A resistor $R_o$ is provided in series with MTJ bit 100 to measure the electrical response ($I_T$) of MTJ bit 100 to applied voltage $V_T$. The ratio $V_T/I_T$ defines the tunneling resistance $R_T$ of MTJ bit 100. Tunneling resistance $R_T$ can have different values depending upon the relative orientation of the magnetization direction of free region 50 with respect to fixed region 20.

When the magnetization direction of free region 50 is parallel to that of fixed region 20, $R_T$ may have a relatively low value $R_{T-Min}$ (minimum tunneling resistance), and when the magnetization direction of free region 50 is anti-parallel to that of fixed region 20, $R_T$ may have a relatively higher value $R_{T-Max}$ (maximum tunneling resistance). The magnetization direction of free region 50 can be changed (e.g., to be parallel or anti-parallel to that of fixed region 20) by, for example, the magnetic field generated by passing a current $I_M$ through a nearby conductor 150, or spin-transfer-torque by passing an electrical current through MTJ bit 100, or spin-orbit-torque by passing an electrical current through a layer (not shown in FIG. 1) in contact with free region 50 (FIG. 1) in MTJ bit 100.

MTJ device 200 can function as a memory or a sensor by measuring the resistance $R_T$ of its MTJ bit 100. The ratio of the change in resistance $R_T$ of MTJ bit 100 is called magnetoresistance ratio (MR=$(R_{T-Max}-R_{T-Min})/R_{T-Min}$). For increased sensitivity of MTJ device 200 (e.g., a device with a good read signal), a bigger difference between $R_{T-Min}$ and $R_{T-Max}$, and thus a larger MR, is desirable. It is known that a substantially defect-free intermediate region 30 (e.g., tunnel barrier layer) improves the performance of MTJ device 200. At the same time, the process of forming the tunnel barrier layer must be relatively simple and amenable to mass fabrication techniques (e.g., not involve inordinate amounts of time, use standard fabrication equipment/processes, etc.) to lower costs. In MTJ device 200, the occurrence of individual MTJ bits 100 with low MR values (that may indicate a hard or a partial electrical short) may result in low manufacturing yields and thus increased cost.

The structure of MTJ bit 100 illustrated in FIG. 1 is only exemplary. In general, MTJ bit 100 can have any suitable structure. FIG. 2A illustrates another exemplary structure of an MTJ bit 100' that may be used in MTJ device 200 of FIG. 1. As illustrated in FIG. 2A, fixed region 20 and free region 50 of MTJ bit 100' may include multiple regions/layers arranged one over the other to form a stack of layers between bottom and top electrodes 10, 70. Although not shown in FIG. 2A, in some embodiments, MTJ bit 100' may be formed between two metal layers (e.g., M1 and M2 metal layers, M2 and M3 metal layers, etc.) of the MTJ device. For example, bottom electrode 10 may be formed on an interconnect structure of a semiconductor substrate (of MTJ device) that is in electrical contact with, for example, CMOS circuitry (e.g., transistors, etc.) on the substrate. Bottom and top electrodes 10, 70 may comprise an electrically conductive material (e.g., tantalum (Ta), titanium (Ti), tungsten (W), or an alloy of these elements (e.g., tantalum-nitride alloy), etc.). In some embodiments, one or both of bottom electrode or top electrode 10, 70 may be eliminated.

In MTJ bit 100' of FIG. 2A, fixed region 20 includes two ferromagnetic regions 14 and 18 separated by an antiferromagnetic coupling region 16. Ferromagnetic regions 14, 18 may include one or more of nickel, iron, cobalt, or boron, including their alloys, or engineered materials with one or more of the elements palladium (Pd), platinum (Pt), chromium (Cr), and alloys thereof. Coupling region 16 may include, for example, iridium (Ir), ruthenium (Ru), rhenium (Re), or rhodium (Rh). In some embodiments, one or both of ferromagnetic regions 14, 18 may include cobalt (Co), iron (Fe), and/or boron (B) in, e.g., an alloy such as CoFeB.

Although not shown in FIG. 2A, in some embodiments, fixed region 20 may also include a transition region and/or a reference region disposed on or above region 18 to facilitate/improve the growth of the overlying intermediate region 30. In some embodiments, fixed region 20 also may include one or more non-magnetic material layers, such as, for example, ruthenium, rhodium, platinum, palladium, rhenium, iridium, copper, aluminum, tantalum, titanium, niobium, vanadium, zirconium, iridium, one or more alloys of these elements, and in certain embodiments, tungsten and molybdenum. In some embodiments, fixed region 20 also may include an antiferromagnetic pinning layer including materials such as, for example, a platinum manganese alloy (PtMn), an iridium manganese alloy (IrMn), a platinum palladium manganese alloy (PtPdMn), a nickel manganese alloy (NiMn), etc. Although not a requirement, typically fixed region 20 may have a thickness between approximately 8-300 Å, between approximately 15-110 Å, greater than or equal to 8 Å, greater than or equal to 15 Å, less than or equal to 300 Å, or less than or equal to 110 Å.

Free region 50 may include ferromagnetic regions 42 and 46 separated by an insertion region 44 that provides ferromagnetic or antiferromagnetic coupling between ferromagnetic regions 42, 46. Ferromagnetic regions 42, 46 may include alloys of one or more of nickel, iron, and/or cobalt, and in some embodiments, boron. In some embodiments, ferromagnetic regions 42, 46 may include one or more alloys of cobalt, iron, and boron (e.g., CoFeB). Free region 50 also may include an iron rich layer or region disposed between ferromagnetic region 42 and intermediate region 30 and/or between ferromagnetic region 46 and top electrode 70. Insertion region 44 may include any nonmagnetic material, such as, for example, tantalum (Ta), tungsten (W), molybdenum (Mo), ruthenium (Ru), rhodium (Rh), rhenium (Re), iridium (Ir), chromium (Cr), osmium (Os), hafnium (Hf) and their combinations. Although free region 50 of FIG. 2A is illustrated as comprising two ferromagnetic regions 42 and 46 separated by a single insertion region 44, this is only exemplary. In general, free region 50 may have any number of ferromagnetic regions with insertion regions provided between the adjacent ferromagnetic regions. Free region 50 may have any thickness. In some embodiments, free region 50 may have a thickness between approximately 7-130 Å.

Intermediate region 30 may include any dielectric material. In some embodiments, intermediate region 30 may include an oxide material, such as, for example, magnesium oxide ($MgO_x$) or aluminum oxide ($AlO_x$ (e.g., $Al_2O_3$)). Intermediate region 30 functions as a tunnel barrier in MTJ bit 100'. In general, intermediate region 30 may have any thickness. In some embodiments, intermediate region 30 may have a thickness between approximately 8.5-14.1 Å, preferably between approximately 9.6-13.0 Å, and more preferably between approximately 9.8-12.5 Å. As will be described in more detail below, in some embodiments, intermediate region 30 may be formed by depositing a layer of material (such as, for example, magnesium, aluminum, etc.) and then oxidizing the deposited material. In some embodiments, this process may include multiple steps of material deposition and oxidation.

Although FIG. 2A (and FIG. 1) illustrates free region 50 as being formed above fixed region 20, this is not a requirement. In some embodiments, fixed region 20 may be formed above free region 50 (with intermediate region 30 positioned between them). In some embodiments, as illustrated in FIG. 2B, an MTJ bit 100" may have a dual spin filter (DSF) structure where two fixed regions 20A, 20B are positioned on either side of a free region 50 with intermediate regions 30A and 30B positioned between the fixed and free regions. The two fixed regions 20A, 20B and/or free region 50 may have a single-layer or a multi-layer structure (for example, as shown in FIG. 2A). The structures of MTJ bits illustrated in FIGS. 1, 2A, and 2B are only exemplary and an MTJ bit of the current disclosure can have any now-known or future developed stack/structure (including one or more synthetic antiferromagnetic (SAF) structures, synthetic ferromagnetic (SyF) structures, etc.). U.S. Pat. Nos. 8,686,484; 8,747,680; 9,023,216; 9,136,464; and 9,419,208, Patent Application Publication No. 2018/0158498, and U.S. patent application Ser. No. 16/188,934(filed Nov. 13, 2018); U.S. patent application Ser. No. 16/202,496 (filed Nov. 28, 2018); U.S. patent application Ser. No. 16/179,112 (filed Nov. 2, 2018); U.S. patent application Ser. No. 16/175,205 (filed Oct. 30, 2018), and U.S. patent application Ser. No. 16/190,299 (filed Nov. 14, 2018), incorporated by reference in their enterities herein, describe exemplary structures that may be used as MTJ bits of the current disclosure.

It should be noted that, although MTJ bits comprising distinct regions (or regions/layers with distinct interfaces) are illustrated in FIGS. 1, 2A, and 2B, this is only exemplary. As known to one skilled in the art, the interface between adjacent regions of a magnetoresistive stack may, in some cases, be characterized by compositional (e.g., chemical) and/or structural changes due to intermixing between the materials (or intermetallic formation) of the adjacent regions (e.g., during deposition, post deposition annealing, etc.). For example, while the compositional profile across an ideal interface (i.e., an interface which does not undergo compositional changes) between two regions (or layers) may indicate a sharp profile (i.e., the composition abruptly changes from the composition of one region to that of the other region), the compositional profile across a typical interface of the illustrated stacks may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

Exemplary methods of fabricating selected embodiments of the disclosed MTJ bits (e.g., MTJ bits 100, 100', 100", etc.) will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 3 depicts a flow chart of an exemplary method 300 of fabricating MTJ bit 100 (of FIG. 1), according to the present disclosure. In the discussion below, reference will be made to both FIGS. 1 and 2A-2B. A first electrode (e.g., bottom electrode 10) may be first formed on the backend (surface with circuitry) of a semiconductor substrate by any suitable process (step 310). A fixed region 20 then may be formed on or above an exposed surface of electrode 10 (step 320). In embodiments where fixed region 20 is a multi-layer stack that includes multiple stacked regions (e.g., see FIG. 2A), fixed region 20 may be formed by providing (e.g., sequentially) the different regions (e.g., regions 14, 16, and 18 of FIG. 2A) that comprise fixed region 20 on or above the surface of electrode 10. In some embodiments, fixed region 20 also may be formed by providing an antiferromagnetic pinning layer between region 14 and bottom electrode 10. An intermediate region 30 then may be formed on or above an exposed surface of fixed region 20 (step 330). A free region 50 may then be formed on or above the exposed surface of the intermediate region 30 (step 340). Although not a requirement, in some embodiments, a barrier layer may be formed between intermediate region 30 and free region 50. In embodiments where a barrier layer is provided, the barrier layer may be formed of material(s) that prevents or reduces the migration of one or more materials in the intermediate region 30 into free region 50. In embodiments where free region 50 is a multi-layer stack, free region 50 may be formed by providing (e.g., sequentially providing) the different regions (e.g., regions 42, 44, and 46 of FIG. 2A) that comprise the stack of free region 50. Second electrode 70 may now be formed on an exposed surface of free region 50 (step 350). As those of ordinary skill in the art will readily recognize, method 300 may be appropriately modified to provide for the formation of any additional layers or regions.

Any suitable process may be used to form the different regions of MTJ bit 100. In some embodiments, forming the different regions may include depositing the material of the region by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition of the fixed and free regions 20 and 50, a magnetic field may be applied to set a preferred easy magnetic axis of the region (e.g., via induced anisotropy). Similarly, a strong magnetic field applied during the post-deposition high-temperature anneal step may be used to induce a preferred easy magnetic axis and a preferred pinning direction for any antiferromagnetically pinned materials or exchange coupled pinning materials. Since these techniques are known to those of ordinary skill in the art, they are not described here in greater detail.

In some embodiments, forming intermediate region 30 (i.e., step 330 of FIG. 3) may include directly depositing an insulating material (e.g., using physical vapor deposition from an oxide target) on a surface of fixed region 20. In some embodiments, forming intermediate region 30 may include deposition of an oxidizable metal film or layer followed by oxidation of the deposited film. In some embodiments, forming intermediate region 30 (i.e., step 330 of FIG. 3) may include multiple steps of oxidizable metal deposition and oxidation of the deposited metal. For example, with reference to FIG. 1, a first layer of an oxidizable metal may be deposited on an exposed surface of fixed region 20 and the deposited metal may be oxidized (fully or partially). A second layer of oxidizable metal (same or different material as the first layer) may then be deposited on oxidized metal oxide layer and oxidized. Several such deposition and oxidation steps may be carried out to form intermediate region 30.

FIG. 4A is a flow chart of an exemplary method 400 of forming intermediate region 30 (i.e., step 330 of FIG. 3). FIG. 4B is a schematic representation of the method of FIG. 4A. A first layer of an oxidizable material (for example, an oxidizable metal such as magnesium (Mg), aluminum (Al), etc.) is formed on or above a surface of fixed region 20 (step 410). The layer of oxidizable material may be formed by any process (e.g., deposited by DC sputtering, RF sputtering, etc.). The deposited layer is then oxidized (step 420) to at least partially convert the deposited first layer of oxidizable material to a metal oxide (magnesium oxide (MgO), aluminum oxide ($Al_2O_3$), etc.). The oxidization in step 420 is accomplished, for example, by using at least one of natural oxidation, exposure to oxygen radicals, an argon and oxygen plasma, or remote oxygen plasma. In one embodiment, the oxidation dose (or oxygen dose) during the oxidation step is controlled by a combination of the time of exposure, pressure, concentration of oxygen in the oxidation gas, time of exposure to the oxidation gas, etc. For other techniques, other parameters well known in the art, such as RF power, etc. may be used to control the oxygen dose. A second layer of oxidizable material may then be formed (e.g., deposited) on the oxidized first layer (step 430). The deposited second layer is then oxidized to at least partially convert the deposited second layer of oxidizable material to a metal oxide (step 440). Similar to the oxidization in step 420, the oxidization of the deposited second layer in step 440 may be accomplished, for example, by using at least one of natural oxidation, exposure to oxygen radicals, an argon and oxygen plasma, and an remote oxygen plasma. A third layer of oxidizable material may then be deposited on the oxidized second layer (step 540). The deposited third layer of oxidizable material may then be at least partially oxidized to form a metal oxide. Similar to oxidization step 420 and 440, the oxidization in step 460 may be accomplished, for example, by using at least one of natural oxidation, exposure to oxygen radicals, an argon and oxygen plasma, and a remote oxygen plasma. Thus, in some embodiments, intermediate region 30 is formed by deposing and then oxidizing three layers of an oxidizable metal material. It should be noted that, in general, intermediate region 30 may be formed using any number of cycles (n layers, e.g., 1-10) of material deposition and oxidation as indicated in FIG. 4B.

In some embodiments, formation of the first, second, and third layers of oxidizable material in steps 410, 430, and 450 may be performed using a physical vapor deposition process (such as, for example, ion beam deposition, molecular beam epitaxy, magnetron sputtering, etc.). Although not a requirement, in some embodiments, the same oxidizable material (e.g., Al, Mg, etc.) may be deposited as the first, second, and third layers of oxidizable material. Any desired thickness or quantity of the oxidizable material may be deposited as the first, second, and third layers of oxidizable material. In some embodiments, each of the first, second, and third layers may have thickness of about 1 to 10 Angstroms, and preferably about 3 to 6 Angstroms. In some embodiments, the thickness of the deposited individual layers may be such that the total thickness of the finally formed intermediate region 30 is the desired value. In some embodiments, the total thickness of the deposited individual layers may be different from the desired thickness of intermediate region 30 to account for a change in thickness during oxide formation.

In some embodiments, the oxidation dose (achieved, for example, by a combination of the time of exposure to oxidation gas, pressure of the gas, concentration of oxygen in the oxidation gas, flow rate of oxidation gas, etc.) during oxidation of the first, second, and third layers of oxidizable material (i.e., in steps 420, 440, 460) may be substantially the same. In some embodiments, the oxidation dose may be expressed as the product of the oxygen flow rate in sccm (standard cubic centimeters per minute) and the time of exposure in seconds. In some embodiments, the first layer of oxidizable material may be oxidized in step 420 using a first oxidation dose, the second layer of oxidizable material may be oxidized in step 440 using a second oxidation dose, and the third layer of oxidizable material may be oxidized in step 460 using a third oxidation dose. In some embodiments, the first, second, and third oxidation doses may be, respectively, the lowest dose, the highest dose, and an intermediate dose between the lowest and highest doses. In some embodiments, the second oxidization dose may be at least 100 times greater than the first oxidization dose and preferably at least 1000 times greater. In some embodiments, the second oxidization dose may be chosen based on the desired tunnel-barrier resistance (e.g., the desired resistance-area product or RA). In some embodiments, the third oxidation dose may be at least 5 times greater than the first oxidization dose or preferably at least 10 times greater.

As explained previously, in general, any type of oxidation may be used in steps 420, 440, and 460 to oxidize the deposited oxidizable material. In some embodiments, the oxidation steps (for example, the last oxidation) can be eliminated. In some embodiments, the oxidizable material may be oxidized using natural oxidation. Oxidation at temperatures less than about 35° C. is referred to as low temperature or natural oxidation because it resembles (in speed and self-limiting behavior) the oxidation that occurs during exposure to air (e.g., clean-room air) at room temperatures. In general, during natural oxidation, the deposited material is exposed to an oxygen containing atmosphere at a pressure between about 0.03-10 milli-Torr at a temperature less than about 35° C. In some embodiments, natural oxidation may include exposing the deposited oxidizable material to substantially pure oxygen or a mixture of oxygen with other gases (e.g., 2-80% oxygen in nitrogen), at a pressure of about 0.03-0.05 milli-Torr or less, for about 5-100 seconds, at temperatures less than about 35° C. In some embodiments, both the deposition of oxidizable material and oxidation of oxidizable material may be performed at an elevated temperature, for example, higher than 35° C., preferably higher than 100° C. In some embodiments, natural oxidation (i.e., step 420) may involve exposing the deposited material to substantially pure oxygen or a mixture of oxygen with other gases (e.g., 2-80% oxygen in nitrogen), at a relatively higher pressure (e.g., between about 0.15 to 10 milli-Ton) for a relatively longer time (e.g., up to about a few thousand seconds, preferably about 100-2000 seconds), at temperatures less than about 35° C. It should be noted that natural oxidation (in steps 420, 440, 460) is typically performed in an enclosed chamber (e.g., an oxidation chamber, deposition chamber, etc.) since oxidizing the deposited material by exposing to clean-room room air may not be a preferred option during IC fabrication (for example, to prevent defective devices due to contamination, etc.).

Natural oxidation causes the deposited oxidizable material to be slowly converted to a relatively dense and pin-hole free oxide. However, the rate of oxidation (or oxidation rate) during natural oxidation is slow and it further decreases with oxide thickness since oxide growth is limited by the rate at which oxygen ions diffuse into the growing oxide film. Therefore, in some embodiments, in addition to natural oxidation, or in place of natural oxidation, one or more of steps 420, 440, and 460 may include plasma oxidation. In embodiments where only plasma oxidation is used, the deposited oxidizable material (in one or more of steps 410, 430, 450) is oxidized using plasma oxidation. In embodiments where plasma oxidation is used in addition to natural oxidation, the deposited oxidizable material (in one or more of steps 410, 430, 450) is first oxidized by natural oxidation and then subjected to plasma oxidation. In some embodiments, plasma oxidation may be carried out in an oxidation chamber having an ion beam source that generates plasma. Plasma oxidation techniques may include, for example, ion beam oxidation, remote plasma oxidation, radical or atomic oxidation, substrate RF plasma oxidation, etc. Since plasma oxidation is well known in the art, it is not described in detail herein.

Though not a requirement, in some embodiments, plasma oxidation may be carried out by exposing the oxidizable material layer (or the naturally oxidized layer) to a process gas comprising substantially pure oxygen or a mixture of oxygen with other gases (e.g., approximately 2-50% oxygen in nitrogen ($N_2$), argon (Ar), xenon (Xe), krypton (Kr), etc.) at a pressure of about 0.1-50 milli-Torr. In some embodiments, an RF plasma generator operating at about 13.56 Mega-Hertz at about 50-500 Watts (or about 50-200 Watts) may be used to generate the plasma. However, different pressure and generator operating conditions may also be used. During plasma oxidation, the plasma excites the oxygen ions in the process gas so that oxidation of any remaining oxidizable material in the deposited oxidizable material layer occurs at a much faster rate as compared to natural oxidation. In some embodiments, the oxidation rate during plasma oxidation may be at least about twice (or at least about ten times, or at least about 100 times) the oxidation rate during natural oxidation. A higher oxidation rate is desirable to decrease throughput time. In some embodiments, higher temperature thermal oxidation, high pressure oxidation, anodic oxidation, etc., may be used in addition to, or in place of plasma oxidation.

In some preferred embodiments of the current disclosure, the process of forming intermediate region 30 (as described with reference to FIG. 4A) may be modified to improve the electrical properties (e.g., to reduce the tunneling resistance RA without generating additional defect or pin-hole in tunneling barrier) of the formed tunnel barrier with minimal impact to its magnetic properties. As will explained in more detail below, in general, the modification may include doping the intermediate region 30 with a different oxidizable metal or alloy (i.e., a second oxidizable metal or alloy different from the first oxidizable metal or alloy) that forms a semiconducting or insulating oxide. Any metal that may oxidized relatively easily may be used as the second oxidizable metal to dope the intermediate region 30. In some embodiments, one or more of tantalum (Ta), hafnium (Hf), titanium (Ti), chromium (Cr), zirconium (Zr), niobium (Nb), molybdenum (Mo), tungsten (W), ruthenium (Ru) and aluminum (Al) (e.g., when the first oxidizable metal is Mg) or their alloys, etc. may be used as the second oxidizable metal. As a person of ordinary skill in the art would recognize, when an intermediate region 30 is formed of a first metal oxide doped with a second metal oxide, any suitable chemical/elemental analysis (such as, for example, energy dispersive x-ray spectroscopy (EDS/EDX, etc.)) will reveal the presence of the two metal oxides in region 30. In general, intermediate region 30 may be doped with the second oxidizable metal while depositing a layer (first layer, second layer, and/or third layer) of the first oxidizable metal, after depositing the layer of first oxidizable metal (and before oxidizing the deposited layer), or after oxidizing the deposited layer of first oxidizable metal. That is, with reference to FIG. 4A, in general, doping may be performed: during steps 410, 430, and/or 450; between steps 410 and 420, steps 430 and 440, and/or steps 450 and 460; or after steps 420, 440, and/or 460.

FIGS. 5A-5C are flow charts of exemplary methods of forming intermediate region 30 (i.e., step 330 of FIG. 3) where doping of the first oxidizable metal with the second oxidizable metal is performed while depositing the first, second, and/or third layers of the first oxidizable metal. FIGS. 6A-6C are corresponding schematic representations of the methods of FIGS. 5A-5C, respectively. With reference to FIGS. 5A and 6A, a first oxidizable metal (e.g., Mg, Al, etc.) and a second oxidizable metal (e.g., Ta, Hf, Ti, Cr, Zr, Nb, Mo, W, Ru Al (if the first oxidizable metal is Mg), etc.) may be co-deposited (i.e., deposited together) on or above the surface of fixed region 20 (see FIG. 1) to form a first layer (step 410'). In general, the relative composition of the first and second oxidizable metals in the deposited first layer may be any value. In some embodiments, the composition of the second oxidizable metal in the first layer may be less than or equal to about 25%, or preferably less than or equal to 15%. The first and second oxidizable metals may be co-deposited using any process known in the art. In some embodiments, first and second oxidizable metals may be co-deposited by magnetron sputtering. Since co-depositing first and second oxidizable metals by magnetron sputtering (and by other methods) is well known in the art, for the sake of brevity, it is not described in detail herein. The deposited first layer is then oxidized (step 420) to oxidize (i.e., at least partially oxidize) the deposited first and second oxidizable metals. The first oxidizable metal is then deposited on the oxidized first layer to form a second layer (step 430), and the deposited second layer is then oxidized (fully or at least partially oxidized). The first oxidizable metal is again deposited on the oxidized second layer to form a third layer (step 450), and the deposited third layer is oxidized (fully or at least partially oxidized) (step 460). Although not a requirement, in some embodiments, the thickness of each of the first, second, and third layers may be between approximately 2-8 Å, or preferably between approximately 3-6 Å, or more preferably between approximately 3.5-4.5 Å. Since, steps 420-460 of FIG. 5A are similar to the corresponding steps of FIG. 4A, they are not described in detail again.

In some embodiments, as illustrated in FIGS. 5A and 6A, only the first layer is formed by co-depositing the first and second oxidizable materials (i.e., step 410'). The second and third layers are formed by depositing a single oxidizable metal (e.g., the first oxidizable metal). In some embodiments, as illustrated in the flow chart of FIG. 5B (and the schematic representation of FIG. 6B), the first and second layers are formed by co-depositing the first and second oxidizable metals (steps 410' and 430'), and the third layer is formed by depositing only the first oxidizable metal (step 450). After depositing each of the first, second, and third layers, the depositing layer is oxidized in steps 420, 440, and 460 (as described with reference to FIG. 4A). In some embodiments, as illustrated in the flow chart of FIG. 5C (and the schematic representation of FIG. 6C), the first, second, and third layers are formed by co-depositing the first and second oxidizable metals (steps 410', 430', and 450'). After depositing each layer, the deposited layer is oxidized (steps 420, 440, 460) prior to depositing the overlying layer.

It should be noted that the embodiments described with reference to FIGS. 5A-5C are only exemplary. In general, any layer of oxidizable metal (i.e., one or more of the first, second, and third layers in the embodiments described above) may be formed by co-depositing the first and second oxidizable metals. For example, in some embodiments, only the second layer may be formed by co-depositing the first and second oxidizable metals, and the first and third layers may be formed by depositing only the first oxidizable metal (see FIG. 6D). Similarly, in some embodiments, only the third layer may be formed by co-depositing the first and second oxidizable metals, and the first and second layers may be formed by depositing only the first oxidizable metal (see FIG. 6E). In some embodiments, multiple layers (e.g., first and second layers, first and $n^{th}$ layers (see FIG. 6F), second and third layers, etc.) may be formed by co-depositing the first and second oxidizable metals, and the remaining layers (if any) may be formed by depositing only the first oxidizable metal. Typically, the number of layers that are co-deposited with the first and second oxidizable metals is selected based on the desired thickness and tunneling resistance (RA) of the tunnel barrier layer. For example, if a tunnel barrier layer having the desired thickness and RA is can be achieved by co-depositing only the first layer with the first and second oxidizable metals, the second and third layers may be deposited with only the first oxidizable metal. Likewise, if a tunnel barrier layer having the desired thickness and RA is achieved by co-depositing only the first and second layers with the first and second oxidizable metals, the third layer may be deposited with only the first oxidizable metal. It should be noted that although the above-described embodiments describe depositing and oxidizing three layers of oxidizable materials, this is only exemplary. As previously explained, and as illustrated in FIGS. 6A-6E, in general, any number of layers (n layers, e.g., 1, 2, 3, 4, 5, 6, 7, 8, 9, 10, etc.) of oxidizable materials may be deposited and oxidized. And, some of all of these layers may be co-deposited with first and second oxidizable metals. In some embodiments, co-deposition of the first and second oxidizable metal steps (for example, step 410' in FIG. 5A) may include co-deposition of the first and the second metal oxides/nitrides by RF sputtering from first and the second metal oxides targets or by reactive sputtering from first and the second metal targets. The following oxidation step (for example, step 420 in FIG. 5A) may not be necessarily needed for co-deposition of oxides, depending on the requirement of MTJ RA and co-deposition process.

In the embodiments described above, at least one layer is formed by co-depositing first and second oxidizable metals and then oxidizing the deposited metals. However, this is not a requirement, and in some embodiments, the two oxidizable metals may be deposited separately. That is, in some embodiments, in addition to or as an alternative to co-depositing the two metals together in some layers, after one oxidizable metal is deposited and oxidized (e.g., the first oxidizable metal is deposited and oxidized), the other metal (i.e., second oxidizable metal) is separately deposited (i.e., on the oxidized layer) and oxidized. FIGS. 7A-7C are flow charts of exemplary methods of forming intermediate region 30 (i.e., step 330 of FIG. 3) by depositing and oxidizing the two oxidizable metals separately. FIGS. 8A-8C are corresponding schematic representations of the methods of FIGS. 7A-7C, respectively. With reference to FIG. 7A, after the first oxidizable metal is deposited to form a first layer (step 410) and oxidized (step 420), the second oxidizable metal is deposited on or above the oxidized first layer (step 424) and oxidized (step 426). Any previously described process for depositing and oxidizing the first oxidizable metal may also be used to deposit and oxidize the second oxidizable metal in steps 424 and 426. Although, in general, any thickness of the first and second oxidizable metals may be deposited in steps 410 and 424, in some embodiments, the thickness of the deposited first oxidizable metal (i.e., first layer) in step

410 may be between approximately 2-8 Å (or preferably between approximately 3-6 Å, or more preferably between approximately 3.5-4.5 Å), and the thickness of the deposited second oxidizable metal in step 424 may be less than or equal to (≤) approximately 1 Å. In some embodiments, the second oxidizable metal may be deposited (in step 424) to form a dusting (e.g., a discontinuous patchwork as opposed to a continuous layer) on the oxidized first layer. The first oxidizable metal may then be deposited (on the oxidized second oxidizable metal) to form a second layer (step 430) and oxidized (step 440). The first oxidizable metal may again be deposited on the oxidized second layer to form a third layer (step 450) and oxidized (step 460). In some embodiments, the thickness of the second and third layers may also be same as the first layer (i.e., between approximately 2-8 Å, or preferably between approximately 3-6 Å, or more preferably between approximately 3.5-4.5 Å).

It should be noted that the relative thicknesses and configurations of the first and second oxidizable metal layers (marked "First metal" and "Second metal") depicted in FIG. 7A (and in other schematic representations in this disclosure) is merely exemplary. As described above, the first and second oxidizable metal layers may have different thicknesses and configurations (e.g., continuous layer, discontinuous layer, etc.). Further, although the first and second oxidizable metals are deposited (and oxidized) separately, after formation of MTJ device 100, a compositional analysis may indicate that the intermediate region 30 is formed of a mixture of the oxides of the first and second oxidizable metals.

In some embodiments, as illustrated in FIGS. 7B and 8B, after depositing and oxidizing the first oxidizable metal of the first layer (steps 410 and 420), the second oxidizable metal is deposited and oxidized (steps 424 and 426). The first oxidizable metal is deposited over the oxidized second oxidizable metal to form the second layer (step 430) and oxidized (step 440). The second oxidizable metal is again deposited (step 444) over the oxidized second layer and oxidized (step 446). The first oxidizable metal is then deposited over the oxidized layer (i.e., the oxidized second oxidizable metal) form the third layer (step 450) and oxidized (step 460). In some embodiments, as illustrated in FIGS. 7C and 8C, after depositing and oxidizing the first oxidizable metal of the third layer (steps 450 and 460), the second oxidizable metal is again deposited (step 464) over the oxidized third layer and oxidized (step 466). In the embodiments of FIGS. 7B and 7C, the thickness of the deposited first oxidizable metal in the steps 410, 430, and 450 may be between approximately 2-8 Å (or preferably between approximately 3-6 Å, or more preferably between approximately 3.5-4.5 Å), and the thickness of the deposited second oxidizable metal in steps 424, 444, and 464 may be less than or equal to approximately 1 Å.

It should be noted that the embodiments described with reference to FIGS. 7A-7C (and 8A-8C) are only exemplary. In general, the second oxidizable metal may be deposited over any (or all) of the first oxidizable metal layer(s). For example, in some embodiments, as illustrated in FIG. 8D, the second oxidizable metal layer may only be deposited on the oxidized second layer. Typically, the number of layers of the first oxidizable metal that are deposited, and the number of these layers upon which a dusting of the second oxidizable metal is deposited, may be selected based on the desired thickness and tunneling resistance (RA) of the tunnel barrier layer. In some embodiments, as illustrated in FIG. 8E, in addition to depositing the second oxidizable metal separately over an oxidized layer (i.e., the oxidized first oxidizable metal layer), one or more of the layers may be formed (first layer in FIG. 8E) by co-depositing the first and second oxidizable metals. As previously explained, and as illustrated in FIGS. 8A-8E, in general, any number of layers (n layers, e.g., 1, 2, 3, 4, 5, 6, 7, 8, 9, 10, etc.) of the first oxidizable metal may be deposited and oxidized. And, the second oxidizable metal may be deposited and oxidized on some of all of these layers. In some embodiments, the deposition of the second oxidizable metal (for example, step 424 in FIG. 7A) may include, or may be replaced by, deposition of the second oxidizable metal oxide or nitride by RF sputtering from a second oxidizable metal oxide target or reactive sputtering from the second oxidizable metal.

As explained previously, in general, the thickness of a deposited first oxidizable metal layer may be between approximately 2-8 Å (or preferably between approximately 3-6 Å, or more preferably between approximately 3.5-4.5 Å), and the thickness of the deposited second oxidizable metal may be less than or equal to approximately 1 Å (e.g., approximately 0.5 Å). For example, in some embodiments, with reference to FIGS. 7A and 8A, after depositing and oxidizing an approximately 4 Å thick layer of the first oxidizable metal, a dusting of the second oxidizable metal (e.g., ≤approximately 1 Å thick) may be deposited and oxidized on the surface of the oxidized layer. One or more additional layers of approximately 4 Å thick first oxidizable metal layers may then be sequentially deposited and oxidized. In some embodiments, a dusting of the second oxidizable metal (e.g., ≤approximately 1 Å thick) may also be deposited and oxidized over some (or all) of these additional first oxidizable metal layers. Additionally or alternatively, in some embodiments, a dusting of the second oxidizable metal may be deposited in between a layer of the first oxidizable metal. For example, with reference to the exemplary embodiment discussed above, instead of (or in addition to) depositing the (≤1 Å thick) second oxidizable metal on the surface of an approximately 4 Å thick layer of the first oxidizable metal, a thinner or a smaller portion (e.g., ≅2 Å thick layer) of the first oxidizable metal may first be deposited and oxidized. A dusting of the second oxidizable metal (having a thickness, for example, ≤approximately 1 Å, approximately 0.5 Å, etc.) may then be deposited and oxidized on the thinner first oxidizable metal, and the remaining portion (e.g., ≅2 Å thick layer) of the first oxidizable metal may then be deposited and oxidized. In some embodiments, a dusting of the second oxidizable metal may be deposited in between a layer of the first oxidizable metal. For example, with reference to the exemplary embodiment discussed above, instead of (or in addition to) depositing the second oxidizable metal (e.g., ≤1 Å thick) on the surface of an approximately 4 Å thick layer of the first oxidizable metal, a thinner or a smaller portion (e.g., ≅2 Å thick layer) of the first oxidizable metal may first be deposited. A dusting of the second oxidizable metal (having a thickness, for example, ≤approximately 1 Å, approximately 0.5 Å, etc.) may then be deposited on the thinner first oxidizable metal, and the remaining portion (e.g., ≅2 Å thick layer) of the first oxidizable metal may then be deposited, and then all layers (the smaller portion of the first oxidizable metal, the dusting of the second oxidizable metal and the remaining portion of the first oxidizable metal) may be oxidized together.

In some embodiments, after depositing a layer of the first oxidizable metal, a dusting of the second oxidizable metal may be deposited on the surface of the first oxidizable metal layer prior to its oxidation. The deposited first and second oxidizable metals may then be oxidized together (using natural oxidation, plasma oxidation, or a combination or natural and plasma oxidation). FIGS. 9A-9C are flow charts of exemplary methods of forming intermediate region 30 (i.e., step 330 of FIG. 3) where the second oxidizable metal is deposited on the first oxidizable metal and the two metals are oxidized together. FIGS. 10A-10C are corresponding schematic representations of the methods of FIGS. 9A-9C, respectively. With reference to FIGS. 9A and 10A, in some embodiments, the first oxidizable metal is deposited (step 410) and the second oxidizable metal is deposited on the first oxidizable metal (step 424). The two oxidizable metals are then oxidized together (step 428). Multiple layers of the first oxidizable metal are then deposited and oxidized on the oxidized surface sequentially (steps 430-460). In some embodiments, as illustrated in FIGS. 9B and 10B, the first layer may be formed by depositing and oxidizing only the first oxidizable metal (steps 410 and 420). The first oxidizable metal is then deposited (step 430) on the oxidized first layer, and the second oxidizable metal is deposited on the first oxidizable metal (step 434). The first and the second oxidizable metals are then oxidized together (step 438). One or more layers of the first oxidizable metal are then deposited (step 450) and oxidized (step 460) sequentially. In some embodiments, as illustrated in FIGS. 9C and 10C, the first and second layers may be formed by depositing and oxidizing only the first oxidizable metal (steps 410-440). The first oxidizable metal is then deposited (step 450) on the oxidized first layer, and the second oxidizable metal is deposited on the first oxidizable metal (step 454). The first and the second oxidizable metals are then oxidized together (step 458).

Although not illustrated in FIGS. 9C and 10C, in some embodiments, one or more additional layers of the first oxidizable metal may then be deposited and oxidized on the oxidized surface. In some embodiments, the thickness of a deposited first oxidizable metal layer may be between approximately 2-8 Å (or preferably between approximately 3-6 Å, or more preferably between approximately 3.5-4.5 Å), and the thickness of the deposited second oxidizable metal may be less than or equal to approximately 1 Å. It should be noted that although FIGS. 10A-10C (and FIGS. 9A-9C) illustrate embodiments where the second oxidizable metal is deposited on one layer (i.e., the first layer, the second layer, or the third layer), this is only exemplary. In some embodiments, as illustrated in FIGS. 10D-10F, multiple layers may be formed by depositing the first and the second oxidizable metals one over the other and oxidizing the two metals together. In some embodiments, the deposition of the second oxidizable metal (for example, step 424 in FIG. 9A) may include or be replaced by the deposition of the second oxidizable metal oxide/nitride by RF sputtering from the second oxidizable metal oxide target or reactive sputtering from the second oxidizable metal target.

As explained previously, intermediate region 30 functions as the tunnel barrier layer of MTJ bit 100 (of FIG. 1). It is believed that doping the first oxidizable metal (e.g., Mg, Al, etc.) used to form intermediate region 30 with the second oxidizable metal (e.g., Ta, Hf, Ti, Cr, Zr, Nb, Mo, W, Ru, Al, etc.) improves the properties of the tunnel barrier. For example, doping intermediate region 30 as described herein may allow the tunneling resistance (e.g., RA) of the tunnel barrier layer to be reduced without increasing pin holes and other defects, and thus increase reliability and endurance characteristics of the MTJ bits.

FIGS. 11A and 11B illustrate the effect of doping the intermediate region 30 in accordance with different embodiments of the current disclosure on the observed tunneling resistance (RA) and magnetoresistance ratio (MR), respectively, of a magnetoresistive stack. In these figures, the solid line labelled "POR" are the results for a magnetoresistive stack that was not subjected to doping. In all the magnetoresistive stacks used in FIGS. 11A and 11B, the first oxidizable metal used was magnesium and the intermediate region 30 was formed by sequentially depositing and oxidizing three layers of magnesium. The intermediate regions 30 of some of the magnetoresistive stacks were doped with a second oxidizable metal. The x-axis (of FIGS. 11A and 11B) identifies the layer of the intermediate region 30 that was doped with second oxidizable metal. The x-axis label "Post $1^{st}$ Mg depo" corresponds to the results obtained when a dusting of the second oxidizable metal (≤about 1 Å thick) was deposited on the first layer of magnesium (about 4 Å thick), and both oxidizable metals were oxidized together (as described with reference to FIGS. 9A and 10A). Similarly, the x-axis label "Post $2^{nd}$ Mg depo" corresponds to the results obtained when a dusting of the second oxidizable metal (≤about 1 Å thick) was deposited on the second layer of magnesium (about 4 Å thick), and both oxidizable metals were oxidized together (as described with reference to FIGS. 9B and 10B). And, the x-axis label "Post $2^{nd}$ Mg oxi" corresponds to the results obtained when a dusting of the second oxidizable metal was deposited on the oxidized second layer of magnesium (as described with reference to FIG. 8D, similar to FIG. 8D but without oxidation step post deposition of the second oxidizable metal). Both hafnium (Hf) and tantalum (Ta) were used as the second odixizable metal in these studies. The dashed line curves are the results obtained with hafnium as the dopant, and the solid line curves are the results obtained with tantalum as the dopant. As can be seen from these two figures, with Ta an Hf as dopants and without changing the oxidation process/Mg layer thickness, RA and MR of MTJ device can be modified. For example, the RA is increased, and MR is reduced with Ta or Hf dopants. Furthermore, the change of RA and MR is strongly dependent on the dopant material, for example, Ta dopant causes more change in RA and MR than Hf dopant as shown in FIGS. 11A and 11B. With further optimization of the dopant material and thickness, MR and RA of these MTJ devices may match those of standard MTJ devices without any dopant in tunnel barrier, and reduced defects and pinholes in tunnel barrier can be expected, hence leading to improved manufacture yield, endurance and reliability of MTJ device, for example MRAM device.

Although the MTJ devices described above have a bit structure with a single tunnel barrier layer (i.e., a single intermediate region 30 as shown in FIG. 1), similar improvements are expected from embodiments having a dual spin filter structure with two tunnel barrier layers (see FIG. 2B). In some embodiments, a single MTJ (one free region and one fixed region) may include a second intermediate region between free region 50 and top electrode 70 (e.g., intermediate region 30B of FIG. 2B). With reference to FIG. 2B, in some embodiments, the second intermediate region 30B may have smaller RA than the first intermediate region 30A, but may maintain good magnetic properties of free region 50 due to less inter-diffusion between free region 50 and second intermediate region 30B. In the case of a perpendicular MTJ, the free region 50 interfaced with second intermediate region 30B instead of top electrode region 70 generates perpendicular magnetic anisotropy. In some embodiments, the second intermediate region 30B may also be formed by doping the first oxidizable metal used to form intermediate region 30B with the second oxidizable metal (as described with reference to intermediate region 30 of FIG. 1). This doping of second intermediate region 30B may improve the quality of the second intermediate region 30B.

As alluded to above, MTJ bits of the current disclosure may be implemented in a sensor architecture or a memory architecture (among other architectures). For example, in a memory configuration, the MTJ bits may be electrically connected to an access transistor and configured to couple or connect to various conductors, which may carry one or more control signals, as shown in FIG. 12. The MTJ bits of the current disclosure may be used in any suitable application, including, e.g., in a memory configuration. In such instances, the MTJ bits may be formed as an integrated circuit comprising a discrete memory device (e.g., as shown in FIG. 13A) or an embedded memory device having a logic therein (e.g., as shown in FIG. 13B), each including MRAM, which, in one embodiment is representative of one or more arrays of MRAM having a plurality of MTJ bits, according to certain aspects of certain embodiments disclosed herein.

In one or more aspects, a magnetoresistive device is disclosed. The device may include a first ferromagnetic region, a second ferromagnetic region, and an intermediate region positioned between the first ferromagnetic region and the second ferromagnetic region. The intermediate region may be formed of a dielectric material and comprise at least two different metal oxides.

In various embodiments the device may, additionally or alternatively, include one or more of the following additional aspects: the at least two different metal oxides may include a first metal oxide and a second metal oxide, wherein (a) the first metal oxide may include an oxide of one of magnesium or aluminum, and (b) the second metal oxide may include an oxide of one of tantalum, aluminum, hafnium, titanium, chromium, zirconium, niobium, molybdenum, tungsten, or ruthenium; the first ferromagnetic region may be a fixed magnetic region of the magnetoresistive device and the second ferromagnetic region may be a free magnetic region of the magnetoresistive device; and the first ferromagnetic region may include at least two ferromagnetic layers separated by an antiferromagnetic coupling layer; the intermediate region may be a tunnel barrier of the magnetoresistive device.

In one or more aspects, a method of manufacturing a magnetoresistive device is disclosed. The method may include forming a first ferromagnetic region, forming an intermediate region on or above the first ferromagnetic region, and forming a second ferromagnetic region on or above the intermediate region. The intermediate region may be formed of a dielectric material comprising at least two different metal oxides.

In various embodiments the device may, additionally or alternatively, include one or more of the following additional aspects: forming the intermediate region may include (a) depositing a first oxidizable metal and a second oxidizable metal on or above the first ferromagnetic region, and (b) oxidizing the deposited first and second oxidizable metals to form the at least two different metal oxides; forming the intermediate region may include (a) depositing a first oxidizable metal on or above the first ferromagnetic region, (b) oxidizing the deposited first oxidizable metal to form a first metal oxide, (c) depositing a second oxidizable metal on the first metal oxide, and (d) oxidizing the deposited second oxidizable metal to form a second metal oxide; and forming the intermediate region may include (a) depositing a first oxidizable metal on or above the first ferromagnetic region, (b) depositing a second oxidizable metal on the first oxidizable metal, and (c) oxidizing the deposited first and second oxidizable metals together to form the at least two different metal oxides; the at least two different metal oxides may include a first metal oxide and a second metal oxide, and wherein (a) the first metal oxide may include an oxide of one of magnesium or aluminum, and (b) the second metal oxide may include an oxide of one of tantalum, aluminum, hafnium, titanium, chromium, zirconium, niobium, molybdenum, tungsten, or ruthenium; forming the intermediate region may include (a) forming a first layer comprising a first oxidizable metal on or above the first ferromagnetic region, (b) oxidizing the first layer to form an at least partially oxidized first layer, (c) forming a second layer comprising the first oxidizable metal on or above the at least partially oxidized first layer, (d) oxidizing the second layer to form an at least partially oxidized second layer, (e) forming a third layer comprising the first oxidizable metal on or above the at least partially oxidized second layer, and (f) oxidizing the third layer to form an at least partially oxidized third layer, wherein at least one of step (a), step (c), or step (e) may include depositing the first oxidizable metal and a second oxidizable metal to form the first, second, or the third layer, and wherein the first and second oxidizable metals are different materials.

In various embodiments the device may, additionally or alternatively, include one or more of the following additional aspects: forming the intermediate region may include (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal on at least one of: (i) the at least partially oxidized first layer prior to step (c), (ii) the at least partially oxidized second layer prior to step (e), and (iii) the at least partially oxidized third layer; forming the intermediate region may include (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal and oxidizing the deposited second oxidizable metal on at least one of: (i) the at least partially oxidized first layer prior to step (c), (ii) the at least partially oxidized second layer prior to step (e), and (iii) the at least partially oxidized third layer; forming the intermediate region may include (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal on at least one of: (i) the first layer prior to step (b), (ii) the second layer prior to step (d), and (iii) the third layer prior to step (f); forming the intermediate region may include: depositing a first oxidizable metal on or above the first ferromagnetic region, depositing a second oxidizable metal on or above the first ferromagnetic region, and oxidizing the first and the second oxidizable metals to form the dielectric material comprising the at least two different metal oxides.

In one or more aspects, a method of manufacturing a magnetoresistive device is disclosed. The method may include forming a first ferromagnetic region, forming an intermediate region on or above the first ferromagnetic region, and forming a second ferromagnetic region on or above the intermediate region. Forming the intermediate region may include depositing a first oxidizable metal on or above the first ferromagnetic region, depositing a second oxidizable metal on or above the first ferromagnetic region, wherein the first and second oxidizable metals are different materials, and oxidizing the deposited first and the second oxidizable metals in a single oxidation step or multiple oxidation steps to form a dielectric material comprising oxides of the first and second oxidizable metals.

In various embodiments the device may, additionally or alternatively, include one or more of the following additional aspects: depositing the first oxidizable metal and depositing the second oxidizable metal may include co-depositing the first and second oxidizable metals on the first ferromagnetic region; depositing the second oxidizable metal may include depositing the second oxidizable metal on a surface of the deposited first oxidizable metal, and the oxidizing includes oxidizing the deposited first and the second oxidizable metals together in in a single oxidation step; oxidizing the deposited first and the second oxidizable metals may include (a) oxidizing the deposited first oxidizable metal to form an oxide of the first oxidizable metal in a first oxidation step, and (b) oxidizing the deposited second oxidizable metal to form an oxide of the second oxidizable metal in a second oxidation step, and depositing the second oxidizable metal may include depositing the second oxidizable metal on the oxide of the first oxidizable metal after the first oxidation step; and depositing the first oxidizable metal may include depositing one of magnesium or aluminum, and depositing the second oxidizable metal includes depositing one of tantalum, aluminum, hafnium, titanium, chromium, zirconium, niobium, molybdenum, tungsten, or ruthenium.

Although various embodiments of the present disclosure have been illustrated and described in detail, it will be readily apparent to those skilled in the art that various modifications may be made without departing from the present disclosure or from the scope of the appended claims.

What is claimed is:

1. A method of manufacturing a magnetoresistive device, comprising:
   forming a first ferromagnetic region;
   forming an intermediate region on or above the first ferromagnetic region, wherein the intermediate region is formed of a dielectric material comprising at least two different metal oxides; and
   forming a second ferromagnetic region on or above the intermediate region;
   wherein forming the intermediate region includes (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal on at least one of:
   (i) the at least partially oxidized first layer prior to step (c);
   (ii) the at least partially oxidized second layer prior to step (e); and
   (iii) the at least partially oxidized third layer.

2. The method of claim 1, wherein forming the intermediate region includes (a) depositing a first oxidizable metal and a second oxidizable metal on or above the first ferromagnetic region, and (b) oxidizing the deposited first and second oxidizable metals to form the at least two different metal oxides.

3. The method of claim 1, wherein forming the intermediate region includes (a) depositing a first oxidizable metal on or above the first ferromagnetic region, (b) oxidizing the deposited first oxidizable metal to form a first metal oxide, (c) depositing a second oxidizable metal on the first metal oxide, and (d) oxidizing the deposited second oxidizable metal to form a second metal oxide.

4. The method of claim 1, wherein forming the intermediate region includes (a) depositing a first oxidizable metal on or above the first ferromagnetic region, (b) depositing a second oxidizable metal on the first oxidizable metal, and (c) oxidizing the deposited first and second oxidizable metals together to form the at least two different metal oxides.

5. The method of claim 1, wherein the at least two different metal oxides includes a first metal oxide and a second metal oxide, and wherein (a) the first metal oxide includes an oxide of one of magnesium or aluminum, and (b) the second metal oxide includes an oxide of one of tantalum, aluminum, hafnium, titanium, chromium, zirconium, niobium, molybdenum, tungsten, or ruthenium.

6. The method of claim 1, wherein forming the intermediate region includes (a) forming a first layer comprising a first oxidizable metal on or above the first ferromagnetic region, (b) oxidizing the first layer to form an at least partially oxidized first layer, (c) forming a second layer comprising the first oxidizable metal on or above the at least partially oxidized first layer, (d) oxidizing the second layer to form an at least partially oxidized second layer, (e) forming a third layer comprising the first oxidizable metal on or above the at least partially oxidized second layer, and (f) oxidizing the third layer to form an at least partially oxidized third layer, wherein at least one of step (a), step (c), or step (e) includes depositing the first oxidizable metal and a second oxidizable metal to form the first, second, or the third layer, and wherein the first and second oxidizable metals are different materials.

7. The method of claim 1, wherein forming the intermediate region includes (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal and oxidizing the deposited second oxidizable metal on at least one of:

(i) the at least partially oxidized first layer prior to step (c);
(ii) the at least partially oxidized second layer prior to step (e); and
(iii) the at least partially oxidized third layer.

8. The method of claim 1, wherein forming the intermediate region includes (a) depositing a first oxidizable metal on or above the first ferromagnetic region to form a first layer, (b) oxidizing the first layer to form an at least partially oxidized first layer, (c) depositing the first oxidizable metal on or above the at least partially oxidized first layer to form a second layer, (d) oxidizing the second layer to form an at least partially oxidized second layer, (e) depositing the first oxidizable metal on or above the at least partially oxidized second layer to form a third layer, (f) oxidizing the third layer to form an at least partially oxidized third layer, and (g) depositing a second oxidizable metal on at least one of:
(i) the first layer prior to step (b);
(ii) the second layer prior to step (d); and
(iii) the third layer prior to step (f).

9. The method of claim 1, wherein forming the intermediate region includes:
depositing a first oxidizable metal on or above the first ferromagnetic region;
depositing a second oxidizable metal on or above the first ferromagnetic region; and
oxidizing the first and the second oxidizable metals to form the dielectric material comprising the at least two different metal oxides.

10. A method of manufacturing a magnetoresistive device, comprising:
forming a first ferromagnetic region;
forming an intermediate region on or above the first ferromagnetic region, wherein forming the intermediate region includes:
depositing a first oxidizable metal on or above the first ferromagnetic region;
depositing a second oxidizable metal on or above the first ferromagnetic region, wherein the first and second oxidizable metals are different materials; and
oxidizing the deposited first and the second oxidizable metals in a single oxidation step or multiple oxidation steps to form a dielectric material comprising oxides of the first and second oxidizable metals; and
forming a second ferromagnetic region on or above the intermediate region;
wherein depositing the first oxidizable metal and depositing the second oxidizable metal include co-depositing the first and second oxidizable metals on the first ferromagnetic region.

11. The method of claim 10, wherein depositing the second oxidizable metal includes depositing the second oxidizable metal on a surface of the deposited first oxidizable metal, and the oxidizing includes oxidizing the deposited first and the second oxidizable metals together in in a single oxidation step.

12. The method of claim 10, wherein
oxidizing the deposited first and the second oxidizable metals includes (a) oxidizing the deposited first oxidizable metal to form an oxide of the first oxidizable metal in a first oxidation step, and (b) oxidizing the deposited second oxidizable metal to form an oxide of the second oxidizable metal in a second oxidation step, and
depositing the second oxidizable metal includes depositing the second oxidizable metal on the oxide of the first oxidizable metal after the first oxidation step.

13. The method of claim 10, wherein depositing the first oxidizable metal includes depositing one of magnesium or aluminum, and depositing the second oxidizable metal includes depositing one of tantalum, aluminum, hafnium, titanium, chromium, zirconium, niobium, molybdenum, tungsten, or ruthenium.

14. A method of manufacturing a magnetoresistive device, the method comprising:
forming a first ferromagnetic region, wherein forming the first ferromagnetic region includes:
forming a first ferromagnetic layer;
forming a antiferromagnetic coupling layer above the first ferromagnetic layer; and
forming a second ferromagnetic layer above the coupling layer; and
forming an intermediate region, wherein forming the intermediate region includes:
depositing a first oxidizable metal above the first ferromagnetic region;
depositing a second oxidizable metal above the first ferromagnetic region,
wherein the second oxidizable metal is co-deposited with the first oxidizable metal; and
oxidizing the deposited first and second oxidizable metals.

15. The method of claim 14, wherein the first oxidizable metal includes magnesium or aluminum; and
the second oxidizable metal includes tantalum, aluminum, hafnium, titanium, chromium, zirconium, niobium, molybdenum, tungsten, or ruthenium; and
the method further includes depositing a second ferromagnetic region above the intermediate region.

16. The method of claim 14, wherein the first and second oxidizable metals are oxidized at the same time.

17. The method of claim 14, wherein forming an intermediate region further includes depositing an oxidizable metal layer, wherein the oxidizable metal layer includes the first oxidizable metal and/or the second oxidizable metal.

18. The method of claim 17, wherein the oxidizable metal layer is deposited after the co-deposition of the second oxidizable metal and the first oxidizable metal.

19. The method of claim 14, wherein the co-deposition of the second oxidizable metal and the first oxidizable metal forms an oxidizable metal layer, wherein a composition of the oxidizable metal layer is at least 15% first oxidizable metal and at least 15% second oxidizable metal.

20. The method of claim 19, wherein the oxidizable metal layer has a thickness of approximately 2 Å to approximately 8 Å.

21. The method of claim 14, wherein the second oxidizable metal and the first oxidizable metal are co-deposited using magnetron sputtering.

* * * * *